(12) United States Patent
Ishiguro et al.

(10) Patent No.: US 9,976,229 B2
(45) Date of Patent: May 22, 2018

(54) METHOD FOR PRODUCING NITRIDE SINGLE CRYSTAL

(71) Applicants: Mitsubishi Chemical Corporation, Chiyoda-ku (JP); Tohoku University, Sendai-shi (JP); The Japan Steel Works, Ltd., Shinagawa-ku (JP)

(72) Inventors: Tohru Ishiguro, Miyagi (JP); Quanxi Bao, Miyagi (JP); Chiaki Yokoyama, Miyagi (JP); Daisuke Tomida, Miyagi (JP); Shigefusa Chichibu, Miyagi (JP); Rinzo Kayano, Hokkaido (JP); Mutsuo Ueda, Hokkaido (JP); Makoto Saito, Ibaraki (JP); Yuji Kagamitani, Ibaraki (JP)

(73) Assignees: MITSUBISHI CHEMICAL CORPORATION, Chiyoda-ku (JP); TOHOKU UNIVERSITY, Sendai-shi (JP); THE JAPAN STEEL WORKS, LTD., Shinagawa-ku (JP)

( * ) Notice: Subject to any disclaimer, the term of this patent is extended or adjusted under 35 U.S.C. 154(b) by 398 days.

(21) Appl. No.: 14/500,516

(22) Filed: Sep. 29, 2014

(65) Prior Publication Data

US 2015/0023862 A1 Jan. 22, 2015

Related U.S. Application Data

(63) Continuation of application No. PCT/JP2013/059406, filed on Mar. 28, 2013.

(30) Foreign Application Priority Data

| Mar. 29, 2012 | (JP) | 2012-078010 |
| Mar. 29, 2012 | (JP) | 2012-078011 |
| Mar. 15, 2013 | (JP) | 2013-053474 |

(51) Int. Cl.
| C30B 7/10 | (2006.01) |
| C30B 7/14 | (2006.01) |
| C30B 29/40 | (2006.01) |

(52) U.S. Cl.
CPC .............. *C30B 7/105* (2013.01); *C30B 7/14* (2013.01); *C30B 29/403* (2013.01); *C30B 29/406* (2013.01)

(58) Field of Classification Search
None
See application file for complete search history.

(56) References Cited

U.S. PATENT DOCUMENTS

| 8,609,059 B2 | 12/2013 | Mikawa et al. |
| 2004/0124434 A1 | 7/2004 | D'Evelyn et al. |
(Continued)

FOREIGN PATENT DOCUMENTS

| JP | 2004-002152 | 1/2004 |
| JP | 2006-513122 | 4/2006 |
(Continued)

OTHER PUBLICATIONS

Office Action dated Aug. 23, 2016 in Japanese Patent Application No. 2013-053474 (with unedited computer generated English translation).
(Continued)

*Primary Examiner* — Guinever S Gregorio
(74) *Attorney, Agent, or Firm* — Oblon, McClelland, Maier & Neustadt, L.L.P.

(57) ABSTRACT

A first object of the present invention is to provide a method for efficiently growing a nitride single crystal even under low pressure conditions. The present invention relates to a method for producing a nitride single crystal, comprising growing a nitride crystal on the surface of a seed crystal having a hexagonal crystal structure by setting a pressure in
(Continued)

a reaction vessel having the seed crystal, a nitrogen-containing solvent, a mineralizer containing a fluorine atom, and a raw material placed therein to 5 to 200 MPa and performing control so that the nitrogen-containing solvent is in at least either a supercritical state or a subcritical state.

21 Claims, 5 Drawing Sheets

(56) References Cited

U.S. PATENT DOCUMENTS

| | | | |
|---|---|---|---|
| 2005/0087753 A1* | 4/2005 | D'Evelyn | C30B 9/00 257/98 |
| 2008/0087919 A1 | 4/2008 | Tysoe et al. | |
| 2011/0268645 A1 | 11/2011 | Mikawa et al. | |
| 2012/0251431 A1* | 10/2012 | Fujisawa | C30B 7/10 423/409 |
| 2013/0108537 A1* | 5/2013 | Mikawa | C30B 7/105 423/351 |

FOREIGN PATENT DOCUMENTS

| | | |
|---|---|---|
| JP | 2007-56320 | 3/2007 |
| JP | 2007-509507 | 4/2007 |
| JP | 2008-120672 | 5/2008 |
| JP | 2010-515654 | 5/2010 |
| JP | 2010-222152 | 10/2010 |
| JP | 2010-222247 | 10/2010 |
| JP | 2011-32154 A | 2/2011 |
| JP | 2011-153052 | 8/2011 |
| JP | 2011-153055 | 8/2011 |
| WO | WO 2003/097906 | 11/2003 |

OTHER PUBLICATIONS

Japanese Office Action dated Jan. 10, 2017 in Patent Application No. 2013-053474 (with English Translation).

International Search Report dated May 21, 2013 in PCT/JP2013/059406 filed Mar. 28, 2013.

* cited by examiner

[FIG. 1]
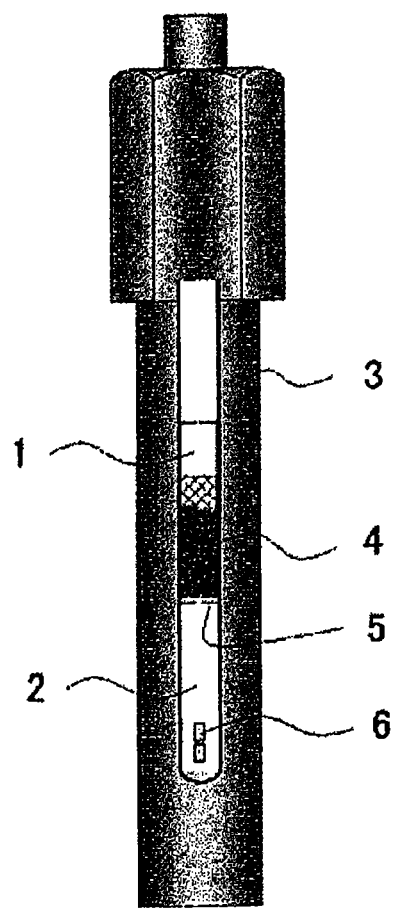

[FIG. 2]
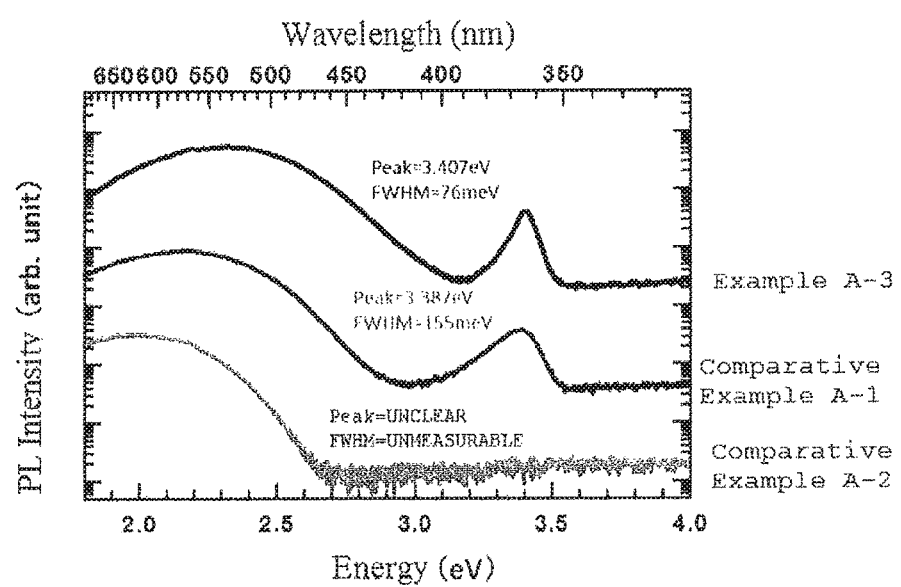

[FIG. 3]
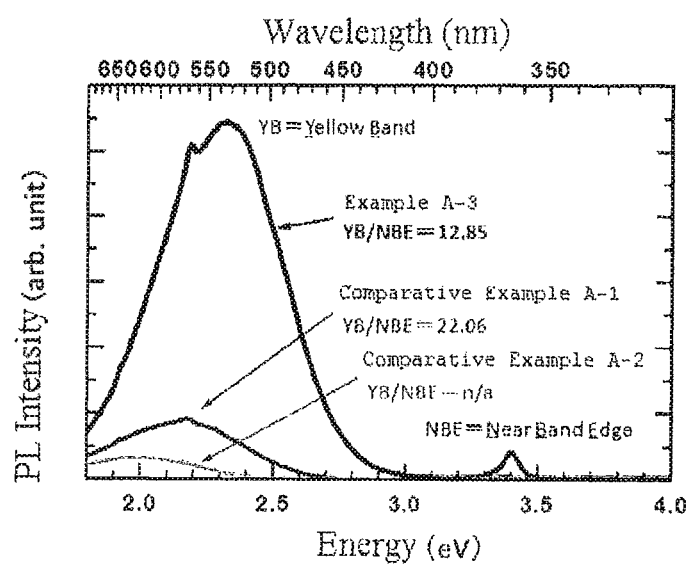

[FIG. 4]
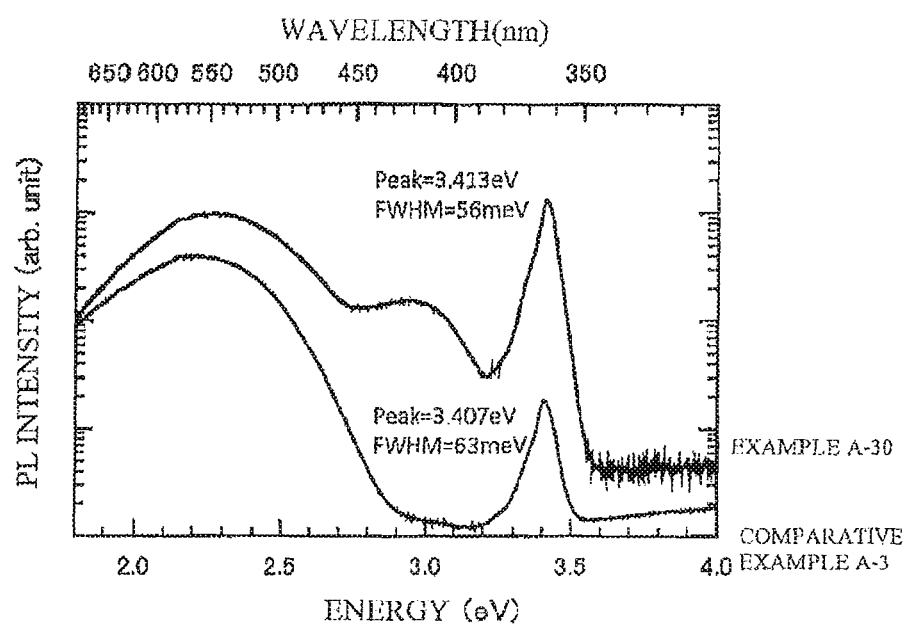

[FIG. 5]
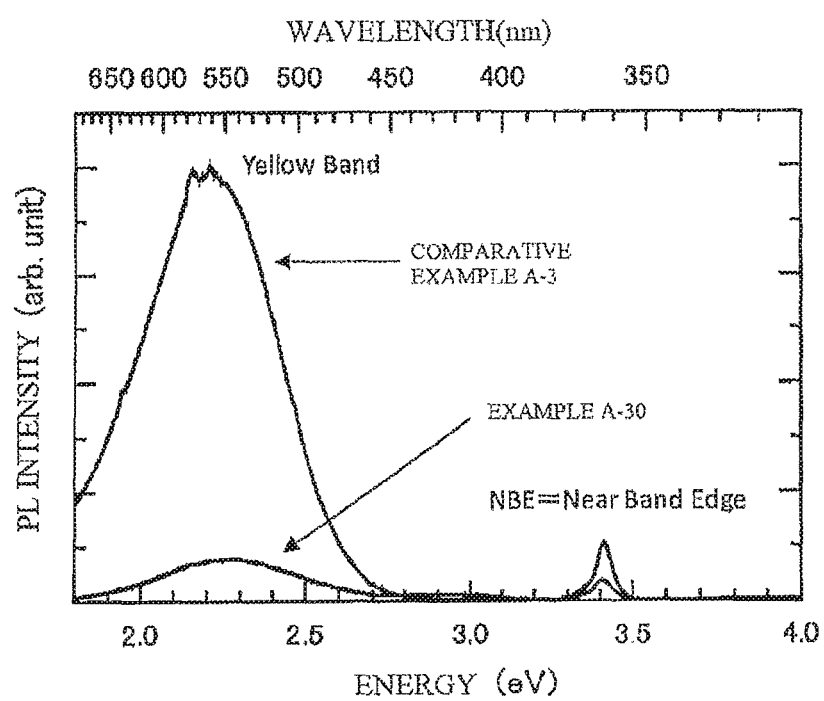

METHOD FOR PRODUCING NITRIDE SINGLE CRYSTAL

TECHNICAL FIELD

The present invention relates to a method for producing a nitride single crystal, and particularly relates to a useful production method when producing a single crystal of a nitride of an element in Group 13 of the periodic table.

BACKGROUND ART

The ammonothermal method is a method for producing a desired material by utilizing the dissolution-precipitation reaction of a raw material using a nitrogen-containing solvent such as ammonia in a supercritical state and/or a subcritical state. When the ammonothermal method is applied to crystal growth, a supersaturated state due to a temperature difference is generated by utilizing the temperature dependence of the solubility of a raw material in a nitrogen-containing solvent such as ammonia, whereby a crystal is deposited.

Specifically, a raw material such as a nitride polycrystal or a seed crystal is placed in a reaction vessel, for example, a pressure resistant vessel such as an autoclave or a capsule, and then, the reaction vessel is hermetically sealed, followed by heating with a heater or the like which is installed inside or outside the reaction vessel, thereby forming a high temperature region and a low temperature region in the reaction vessel, and the raw material is dissolved in one region and a crystal is grown in the other region, whereby a desired crystal is produced.

The nitride polycrystal of GaN or the like to be used as the raw material has an extremely low solubility in a nitrogen-containing solvent such as ammonia in a supercritical state, and therefore, in order to accelerate the crystal growth by improving the solubility, a mineralizer is generally added.

The mineralizer is classified into an acidic mineralizer represented by an ammonium halide $NH_4X$ (X=Cl, Br, or I) and a basic mineralizer represented by an alkali amide $XNH_2$ (X=Li, Na, or K). It is known that the use of an acidic mineralizer as the mineralizer has an advantage that the contamination with an alkali metal impurity which impedes the production of a device is prevented, and the production can be performed using a reaction vessel in which a noble metal is used in an inner wall.

PTL 1 and PTL 2 describe a method for producing a nitride single crystal using an acidic mineralizer. In these literatures, as the acidic mineralizer, ammonium chloride, ammonium iodide, and ammonium bromide are exemplified, and it is described that a GaN crystal is grown under the conditions of 650 to 850° C. and 40 to 250 MPa.

However, there is no description of a mineralizer containing a fluorine atom, and moreover, it is described that even when ammonium chloride was used as the mineralizer under a low pressure condition of 27 MPa or 96 MPa, a GaN crystal could not be grown.

Further, PTL 3 describes that a GaN crystal is grown by using ammonium fluoride as a mineralizer containing a fluorine atom. In this method, a crystal is grown under the conditions of 550 to 3000° C. and 500 to 8000 MPa (5 kbar to 80 kbar), and it is essential to perform this method under high pressure conditions.

On the other hand, the growth of a gallium nitride (GaN) crystal by the ammonothermal method is a reaction in a supercritical state at a high temperature and a high pressure (for example, 500° C. or higher and 150 MPa or more), and therefore, the design of an apparatus and the selection of a material to be made so as to withstand such an environment are naturally restricted. Further, as described above, in order to accelerate the crystal growth by improving the solubility of GaN, a mineralizer is generally added.

The environment of a nitrogen-containing solvent in a supercritical state and/or a subcritical state containing such a mineralizer is a very harsh corrosive environment. Therefore, it is necessary to design an apparatus and select a material such that the apparatus and the material have sufficient corrosion resistance even in such an environment.

For example, in the growth of a GaN crystal by the ammonothermal method using an acidic mineralizer, it is possible to increase the purity of the crystal by using Pt in a reaction vessel. However, since Pt is expensive, it is necessary to design the apparatus using another material if the production is tried to be industrially performed at a reduced cost.

Therefore, it has been proposed that as a lining material for a capsule to be used in the apparatus, Cu, Ag, Mo, Fe, or Ta is used, or as a material for an autoclave, Ti, Fe, Co, Cr, or Ni is used, and so on (see PTL 3 to PTL 8).

CITATION LIST

Patent Literature

PTL 1: JP-A-2011-153055
PTL 2: JP-A-2011-153052
PTL 3: JP-T-2006-513122
PTL 4: JP-A-2010-222247
PTL 5: WO 2003/97906
PTL 6: JP-A-2007-56320
PTL 7: JP-A-2004-2152
PTL 8: JP-A-2010-222152

SUMMARY OF INVENTION

Technical Problem

As described above, when a nitride single crystal is grown by the ammonothermal method, it is necessary to bring the atmosphere to a supercritical state and/or a subcritical state, and therefore, it is essential to use a pressure resistant vessel such as an autoclave. Further, particularly, in the case of using an acidic mineralizer, it is necessary to use a pressure resistant vessel composed of a material capable of withstanding corrosion caused by the acidic mineralizer. In view of this, a high temperature and high pressure reaction is generally performed using an autoclave made of a Ni-based alloy having high corrosion resistance.

However, the Ni-based alloy has a problem of segregation such that the Ni and Cr concentrations vary depending on the place, and therefore, an ingot having a large diameter cannot be produced in the first place. An autoclave is produced by hollowing out an ingot, and therefore, if an ingot having a large diameter cannot be produced, it is not possible to produce a large autoclave so as to try to increase the size of an apparatus or try to promote the mass production of a nitride single crystal.

In consideration of such circumstances, the present inventors thought that if the pressure when a nitride single crystal is grown can be decreased, the wall thickness of an autoclave can be reduced, and therefore, an autoclave having a larger internal volume can be produced from an ingot having the same diameter.

Further, it is known that ammonium fluoride shows a negative solubility characteristic in ammonia at a crystal growth temperature by a usual ammonothermal method. Since the positive or negative sign of the solubility characteristic of ammonium fluoride is reversed to that of ammonium chloride or the like which shows a positive solubility characteristic in ammonia, it is considered that ammonium fluoride cannot be used as a mineralizer which can be used in the same manner as ammonium chloride or the like.

Due to this, PTL 1 or PTL 2 which describes that a GaN crystal is grown at a relatively low pressure does not describe ammonium fluoride. It has been recognized that in the case of using ammonium fluoride, as described in PTL 3, it is essential to adopt high temperature and high pressure conditions.

Under such circumstances, the present inventors started to examine conditions for efficiently growing a nitride single crystal under relatively low pressure conditions. However, it was found that even if a mineralizer as described in PTL 1 or PTL 2 is used, a nitride single crystal cannot be efficiently grown at a low pressure. Further, the examination was performed through a trial and error process by changing various crystal growth conditions, however, satisfactory crystal growth still could not be achieved at a low pressure. Therefore, in order to solve such a problem, a first object of the present invention is to provide a production method capable of efficiently growing a nitride single crystal even under low pressure conditions.

On the other hand, various materials have been proposed as a material constituting an autoclave or a capsule, however, it was found that even if a material is selected as described in PTL 3 to PTL 8 and a GaN crystal is tried to be grown by the ammonothermal method, the corrosion of an autoclave or a capsule cannot be sufficiently prevented depending on the type of the mineralizer or the crystal growth conditions. Therefore, a second object of the present invention is to provide a method capable of obtaining a nitride single crystal having a high purity while preventing the corrosion of the surface of a reaction vessel and a member used inside the reaction vessel.

Solution to Problem

As a result of intensive studies to achieve the above-described first object, the present inventors found that when a nitride crystal was grown at a low pressure by using as a mineralizer, ammonium fluoride, which has been heretofore considered to be able to be used only under high temperature and high pressure conditions, the crystal was grown very efficiently. The present invention has been made based on this finding, and as a means for achieving the first object, the following configurations [1] to [8] (a first embodiment) are provided.

[1] A method for producing a nitride single crystal, comprising growing a nitride crystal on the surface of a seed crystal having a hexagonal crystal structure by setting a pressure in a reaction vessel having the seed crystal, a nitrogen-containing solvent, a mineralizer containing a fluorine atom, and a raw material placed therein to 5 to 200 MPa and performing control so that the nitrogen-containing solvent is in at least either a supercritical state or a subcritical state.

[2] The method for producing a nitride single crystal according to or, wherein the pressure in the reaction vessel in the step of growing a nitride crystal is set to 10 to 200 MPa.

[3] The method for producing a nitride single crystal according to [1] ,or [2], wherein in the reaction vessel, the temperature of a region where the raw material is dissolved is lower than the temperature of a region where a nitride crystal is grown on the surface of the seed crystal.

[4] The method for producing a nitride single crystal according to any one of [1] to [3], wherein the mineralizer contains a halogen atom, and the fluorine atom accounts for at least 50% by mole of the halogen atom.

[5] The method for producing a nitride single crystal according to any one of [1] to [4], wherein the pressure in the reaction vessel and the concentration of the fluorine atom contained in the mineralizer with respect to the nitrogen-containing solvent satisfy the following formula:

$$0.4 \leq P \times M \leq 3.0$$

wherein P represents the pressure [unit: MPa] in the reaction vessel and M represents the concentration [unit: mole/mole of solvent] of the fluorine atom contained in the mineralizer with respect to the nitrogen-containing solvent.

[6] The method for producing a nitride single crystal according to any one of [1] to [5], wherein a temperature at which the nitride crystal is grown on the surface of the seed crystal is 650° C. or lower.

[7] The method for producing a nitride single crystal according to any one of [1] to [6], wherein the reaction vessel comprises a metal containing a Ni-based alloy having a Ni content exceeding 40% by mass.

[8] A nitride single crystal produced by the production method according to any one of [1] to [7].

On the other hand, as a result of intensive studies to achieve the above-described second object, the present inventors found that the corrosion of the surface of the reaction vessel and the like is prevented by including a crystal growing step in which a crystal is grown by using a mineralizer in an atmosphere of a nitrogen-containing solvent in at least either a supercritical state or a subcritical state, and appropriately combining the following (1) to (4), and increased the purity of the crystal. In particular, according to the production method of the present invention, impurities can be reduced without using a noble metal such as Pt, and therefore, the production method of the present invention is advantageous in terms of cost as compared with the production method using Pt.

(1) Ni is contained in at least a part of the surface of the reaction vessel and the surface of a member used inside the reaction vessel.

(2) The mineralizer is a fluorine-based mineralizer and does not contain a halogen atom other than a fluorine atom.

(3) A step of forming a fluorine-containing coating film on at least a part of the surface of the reaction vessel and the surface of a member used inside the reaction vessel is included.

(4) At least a part of the surface of the reaction vessel and the surface of a member used inside the reaction vessel is coated with a fluorine-containing coating film.

That is, the above-described second object is achieved by a method for producing a nitride single crystal (a second embodiment) of the present invention shown in the following [9] to [19].

[9] A method for producing a nitride single crystal, comprising a crystal growing step in which a nitride crystal is grown by using a mineralizer in an atmosphere of a nitrogen-containing solvent in at least either a supercritical state or a subcritical state in a reaction vessel, wherein Ni is contained in at least a part of the surface of the reaction vessel and the surface of a member used inside the reaction vessel, and the mineralizer is a fluorine-based mineralizer and does not contain a halogen atom other than a fluorine atom.

[10] A method for producing a nitride single crystal, comprising:

a crystal growing step in which a nitride crystal is grown by using a mineralizer in an atmosphere of a nitrogen-containing solvent in at least either a supercritical state or a subcritical state in a reaction vessel; and a coating film forming step in which a fluorine-containing coating film is formed on at least a part of the surface of the reaction vessel and the surface of a member used inside the reaction vessel, wherein Ni is contained in at least a part of the surface of the reaction vessel and the surface of a member used inside the reaction vessel.

[11] The method for producing a nitride single crystal according to [10], wherein the coating film forming step is performed simultaneously with at least part of the crystal growing step.

[12] A method for producing a nitride single crystal, comprising a crystal growing step in which a nitride crystal is grown by using a mineralizer in an atmosphere of a nitrogen-containing solvent in at least either a supercritical state or a subcritical state in a reaction vessel, wherein at least a part of the surface of the reaction vessel and the surface of a member used inside the reaction vessel is coated with a fluorine-containing coating film.

[13] The method for producing a nitride single crystal according to any one of [10] to [12], wherein the thickness of the fluorine-containing coating film is from 5 nm to 50 μm.

[14] The method for producing a nitride single crystal according to any one of [9] to [13], wherein at least a part of the surface of the reaction vessel and the surface of a member used inside the reaction vessel comprises a Ni-based alloy having a Ni content exceeding 40% by mass.

[15] The method for producing a nitride single crystal according to any one of [9] to [13], wherein at least a part of the surface of the reaction vessel and the surface of a member used inside the reaction vessel comprises a Ni-based alloy having a Ni content exceeding 50% by mass.

[16] The method for producing a nitride single crystal according to any one of [9] to [15], wherein at least a part of the surface of the reaction vessel and the surface of a member used inside the reaction vessel has a carbon content of 0.2% by mass or less.

[17] The method for producing a nitride single crystal according to any one of [9] to [16], wherein at least a part of the surface of the reaction vessel and the surface of a member used inside the reaction vessel has an Fe content of 5.0% by mass or less.

[18] The method for producing a nitride single crystal according to any one of [9] to [17], wherein at least a part of the surface of the reaction vessel and the surface of a member used inside the reaction vessel comprises at least one selected from Cr, Al, Ti, Nb, V, W, and Mo.

[19] The method for producing a nitride single crystal according to any one of [9] to [18], wherein the crystal growing step is performed multiple times.

Advantageous Effects of Invention

According to the production method of the first embodiment of the present invention, a nitride single crystal can be efficiently grown even under low pressure conditions. As a result, a nitride single crystal can be produced using a pressure resistant vessel having a small wall thickness. Further, the crystal growth can be performed also under low pressure and low temperature conditions, and therefore, it is also possible to reduce the energy cost.

According to the production method of the second embodiment of the present invention, the corrosion of the surface of a reaction vessel and a member used inside the reaction vessel can be prevented, and a nitride single crystal having a high purity can be obtained.

BRIEF DESCRIPTION OF DRAWINGS

FIG. 1 is a schematic view of a crystal production apparatus which can be used in the present invention.

FIG. 2 is a graph showing the PL measurement results of grown crystals obtained in Example and Comparative Examples.

FIG. 3 is a graph showing the PL measurement results of grown crystals obtained in Example and Comparative Examples.

FIG. 4 is a graph showing the PL measurement results of grown crystals obtained in Example and Comparative Example.

FIG. 5 is a graph showing the PL measurement results of grown crystals obtained in Example and Comparative Example.

DESCRIPTION OF EMBODIMENTS

Hereinafter, the method for producing a nitride single crystal of the present invention, and a crystal production apparatus and a member used for the method will be described in detail. Some explanation of the constituent features described below is made based on representative embodiments of the present invention, however, the present invention is not limited to these embodiments. Incidentally, in the description of the present invention, the numerical value range expressed by using "(a numerical value) to (a numerical value)" means a range including the numerical values before and after "to" as the lower limit value and the upper limit value, respectively.

Further, "% by weight" and "% by mass" have the same meaning, and the mere expression "ppm" means "ppm by weight".

[Method for Producing Nitride Single Crystal According to First Embodiment]

(Characteristic Feature of Production Method According to First Embodiment)

The method for producing a nitride single crystal according to a first embodiment of the present invention includes a step of growing a nitride crystal on the surface of a seed crystal having a hexagonal crystal structure by performing control in a reaction vessel having the seed crystal, a nitrogen-containing solvent, a raw material, and a mineralizer placed therein so that the nitrogen-containing solvent is in a supercritical state and/or a subcritical state. The characteristic feature resides in that as the mineralizer, a mineralizer containing a fluorine atom is used, and the pressure in the reaction vessel is set to 5 to 200 MPa.

(Mineralizer)

The mineralizer containing a fluorine atom to be used in the present invention may be any as long as it contains a fluorine atom as an element constituting the mineralizer. Examples of the mineralizer containing a fluorine atom include ammonium fluoride; hydrogen fluoride; hydrocarbyl ammonium fluoride; alkyl ammonium salts such as tetramethyl ammonium fluoride, tetraethyl ammonium fluoride, benzyltrimethyl ammonium fluoride, dipropyl ammonium fluoride, and isopropyl ammonium fluoride; alkyl metal fluorides such as sodium alkyl fluorides; alkali fluorides; alkaline earth metal fluorides; and metal fluorides.

Among these, preferred are an alkali fluoride, an alkaline earth metal fluoride, a metal fluoride; ammonium fluoride, and hydrogen fluoride, more preferred are an alkali fluoride, ammonium fluoride, and a fluoride of a metal in Group 13 of the periodic table, and particularly preferred are ammonium fluoride ($NH_4F$) and gallium fluoride.

By using a mineralizer containing a fluorine atom, a crystal having favorable crystallinity and high quality tends to be obtained.

The mineralizer to be used in the present invention may be composed only of a mineralizer containing a fluorine atom described above, or may be a mixture of a mineralizer containing a fluorine atom and a mineralizer containing no fluorine atom.

Examples of the mineralizer containing no fluorine atom may include acidic mineralizers composed of a halogen other than fluorine and an ammonium ion such as ammonium chloride, ammonium iodide, and ammonium bromide; neutral mineralizers composed of an alkali metal and a halogen such as lithium chloride, lithium bromide, lithium iodide, sodium chloride, sodium bromide, sodium iodide, potassium chloride, potassium bromide, and potassium iodide; neutral mineralizers composed of an alkaline earth metal and a halogen such as beryllium chloride, beryllium bromide, beryllium iodide, magnesium chloride, magnesium bromide, magnesium iodide, calcium chloride, calcium bromide, and calcium iodide; and basic mineralizers such as an alkaline earth metal amide, a rare earth amide, an alkali metal nitride, an alkaline earth metal nitride, an azide compound, and further a hydrazine salt.

In the case of using a mineralizer containing a fluorine atom and a mineralizer containing no fluorine atom, the ratio of the mineralizer containing a fluorine atom to all the mineralizers is set to preferably 50% by mole or more, more preferably 60% by mole or more, and still more preferably 80% by mole or more.

In the present invention, as the mineralizer containing no fluorine atom, from the viewpoint of control of the shape of a crystal to be grown by utilizing the orientation dependence of the growth rate by the mineralizer or control of deposition of miscellaneous crystals, it is preferred to use a mineralizer containing a halogen atom other than a fluorine atom. In this case, the fluorine atom is contained in an amount of preferably 50% by mole or more, more preferably 60% by mole or more, and still more preferably 80% by mole or more of the total amount of all the halogen atoms in the mineralizer.

The mineralizer to be used in the present invention is preferably a mineralizer which shows a negative solubility characteristic in a nitrogen-containing solvent around a temperature at which a nitride crystal is grown. For example, ammonium fluoride shows a negative solubility characteristic in ammonia in a temperature range of 400° C. or higher.

In the production method of the present invention, it is generally preferred to set the temperature of a crystal growth region to 450° C. or higher, and therefore, in the case where only ammonium fluoride is used as the mineralizer, ammonium fluoride shows a negative solubility characteristic at a crystal growth temperature.

On the other hand, in the case where the mineralizer is used in combination with ammonium chloride or the like, which shows a positive solubility characteristic at the temperature, the slope of the solubility curve determined based on the solubility characteristics of the respective mineralizers changes according to the mixing ratio. When the absolute value of the slope of the solubility curve is small, the efficiency of the crystal growth is deteriorated, and therefore, the mixing ratio is adjusted so that the mineralizer has a solubility curve with an appropriate slope.

As for the use amount of the mineralizer to be used in the production method of the present invention, the molar concentration of the fluorine atom contained in the mineralizer with respect to the nitrogen-containing solvent is preferably 0.2% by mole or more, more preferably 0.27% by mole or more, still more preferably 1.0% by mole or more, and particularly preferably 1.5% by mole or more. Further, the molar concentration of fluorine contained in the mineralizer with respect to the nitrogen-containing solvent is preferably 30% by mole or less, more preferably 20% by mole or less, still more preferably 10% by mole or less, and particularly preferably 2% by mole or less.

When the concentration thereof is high, the solubility of the raw material in the nitrogen-containing solvent is increased so that the growth rate tends to be increased, and therefore, a high concentration is preferred. On the other hand, when the concentration thereof is low, the solubility can be kept moderately so that spontaneous nucleation can be suppressed or the degree of supersaturation can be kept low to facilitate the control, and therefore, a low concentration is preferred.

(Pressure)

In the production method of the present invention, a crystal is grown by setting the pressure in the reaction vessel to 5 to 200 MPa. The pressure in the reaction vessel is preferably 10 MPa or more, more preferably 12 MPa or more, still more preferably 15 MPa or more, and particularly preferably 20 MPa or more. Further, the pressure in the reaction vessel is preferably 150 MPa or less, more preferably 120 MPa or less, and still more preferably 100 MPa or less.

The production method of the present invention is characterized in that a nitride crystal can be efficiently grown even at a relatively low pressure. When a crystal is grown at a relatively low pressure, the wall thickness of the pressure resistant vessel can be reduced, and also by increasing the energy efficiency, the cost can be reduced. Further, by growing a crystal at a relatively low pressure equal to or lower than the above-described lower limit, a crystal having favorable crystallinity and high quality tends to be obtained.

(Product of Pressure by Concentration of Mineralizer)

In the production method of the present invention, it is preferred that a product of the pressure P [unit: MPa] in the reaction vessel by the concentration M [unit: mole/mole of solvent] of the fluorine atom contained in the mineralizer with respect to the nitrogen-containing solvent satisfies the following relational formula.

$$0.4 \leq P \times M \leq 3.0$$

The lower limit of the product is preferably 0.4 or more, more preferably 0.5 or more, and still more preferably 0.6 or more. Further, the upper limit of the product is preferably 3.0 or less, more preferably 2.5 or less, and still more preferably 2.2 or less.

By controlling the value of the product to fall within the range from 0.4 to 3.0, the efficiency of crystal growth can be further enhanced. Further, by setting the product to the above-described upper limit or less, the occurrence of a polycrystal adhering to the wall surface of the reaction vessel can be prevented, and the growth of a nitride single crystal on a seed crystal can be accelerated. In addition, by reducing the adhesion of a nitride single crystal to a polycrystal on the wall surface of the reaction vessel and further preventing the depletion of the raw material, the long-term crystal growth tends to be possible.

(Seed Crystal Having Hexagonal Crystal Structure)

In the production method of the present invention, a seed crystal having a hexagonal crystal structure is used. The seed crystal is preferably a crystal having the same elemental composition as that of a nitride single crystal to be produced by the production method of the present invention. As the seed crystal having a hexagonal crystal structure, a nitride of an element in Group 13 of the periodic table is preferably used. For example, a single crystal of a nitride such as gallium nitride or aluminum nitride, is exemplified.

The seed crystal can be determined by considering the solubility in the solvent and the reactivity with the mineralizer. For example, as the seed crystal of GaN, a single crystal obtained by epitaxially growing a crystal on a heterogeneous substrate of sapphire or the like, followed by peeling, a single crystal obtained by growing a crystal from metal Ga with the use of Na, Li, or Bi as a flux, a homo/heteroepitaxially grown single crystal obtained by using a liquid phase epitaxial method (LPE method), a single crystal produced according to a solution growth method, a crystal obtained by cutting such a single crystal, or the like can be used.

A specific method for the above-described epitaxial growth is not particularly limited, and for example, a hydride vapor phase epitaxy method (HVPE method), a metal organic chemical vapor deposition method (MOCVD method), a liquid phase method, an ammonothermal method, or the like can be adopted.

(Nitrogen-Containing Solvent)

In the production method of the present invention, a nitrogen-containing solvent is used.

As the nitrogen-containing solvent, a solvent which does not impair the stability of a nitride single crystal to be grown is exemplified. Examples of such a solvent may include ammonia, hydrazine, urea, amines (for example, a primary amine such as methylamine, a secondary amine such as dimethylamine, a tertiary amine such as trimethylamine, and a diamine such as ethylenediamine), and melamine. One of these solvents may be used alone, or a mixture thereof may be used.

The amount of water or oxygen contained in the solvent is preferably as small as possible, and the content thereof is preferably 1000 ppm or less, more preferably 10 ppm or less, and still more preferably 0.1 ppm or less. In the case of using ammonia as the solvent, the purity thereof is usually 99.9% or more, preferably 99.99% or more, and more preferably 99.999% or more.

(Raw Material)

In the production method of the present invention, a raw material containing an element constituting a nitride crystal to be grown on a seed crystal is used as the raw material. The raw material is preferably a polycrystalline raw material of a nitride crystal and/or a metal to be nitrided, and more preferably gallium nitride and/or metal gallium.

The polycrystalline raw material need not be a complete nitride and depending on the conditions, a metal component in which an element in Group 13 of the periodic table is in a metal state (zero valence) may be contained therein. For example, in the case where the crystal is gallium nitride, examples of the raw material include a mixture of gallium nitride and metal gallium.

A method for producing the polycrystalline raw material is not particularly limited. For example, a nitride polycrystal produced by reacting a metal or an oxide or hydroxide thereof with ammonia in a reaction vessel through which ammonia gas is circulated can be used.

Further, as a metal compound raw material having higher reactivity, a halide, an amide compound, an imide compound, a compound having a covalently bondable M-N bond such as gallazane, or the like can be used. Further, a nitride polycrystal produced by reacting a metal such as Ga with nitrogen at a high temperature and a high pressure can also be used.

The amount of water or oxygen contained in the polycrystalline raw material to be used as the raw material in the present invention is preferably small. The oxygen content in the polycrystalline raw material is usually 10000 ppm or less, preferably 1000 ppm or less, and particularly preferably 1 ppm or less.

The ease of contamination of the polycrystalline raw material with oxygen is associated with the reactivity with water or absorbability of water. As the crystallinity of the polycrystalline raw material is lower, a larger number of active groups such as an NH group are present on the surface and such groups may react with water to partially produce an oxide or a hydroxide. Therefore, as the polycrystalline raw material, it is usually preferred to use a polycrystalline raw material having a crystallinity as high as possible.

The crystallinity can be estimated by a half width of powder X-ray diffraction, and the half width of the (100) diffraction line (in the case of hexagonal gallium nitride, $2\theta$=about 32.5°) is usually 0.25° or less, preferably 0.20° or less, more preferably 0.17° or less.

(Reaction Vessel)

The growth of a nitride single crystal according to the production method of the present invention is performed in a reaction vessel. The reaction vessel as used herein means a vessel for producing a nitride single crystal in a state where a nitrogen-containing solvent in a supercritical state and/or a subcritical state can come into direct contact with an inner wall surface thereof, and an internal structure itself of a pressure resistant vessel, a capsule to be disposed in a pressure resistant vessel, and the like can be exemplified as preferred examples.

The pressure resistant vessel as the reaction vessel to be used in the present invention is selected from those which can withstand high temperature and high pressure conditions when a nitride crystal is grown by the ammonothermal method. In the production method of the present invention, there is no particular limitation as long as the vessel has pressure resistance and corrosion resistance, however, the reaction vessel preferably includes a platinum group metal or a metal containing Ni, more preferably includes a Ni-based alloy.

In particular, in the case where a reaction vessel composed of such a material, it becomes easy to grow a crystal at a low pressure using a mineralizer containing a fluorine atom, and therefore, such a reaction vessel is preferred.

Examples of the metal containing Ni include pure Ni having a carbon content of 0.2% by mass or less (Ni 200, Ni 201, etc.); a Ni-based alloy having a Ni content of 40% by mass or more and a content of Fe and Co as impurity elements of 2.5% by mass or less (for example, Inconel 625, etc. (Inconel is a registered trademark of Huntington Alloys Canada Limited, hereinafter the same shall apply)); and a Ni—Cu alloy having a Ni content of 40% by mass or more (Monet 400, etc.).

The Ni-based alloy may contain Cr, Al, Ti, Nb, or V which forms a nitride in a supercritical $NH_3$ environment, and may further contain W or Mo as a solid solution strengthening element.

Examples of the above-described pure Ni include "Ni 200" which meets the standard of having a carbon content of 0.2% by mass or less and "Ni 201" which meets the standard of having an extra low carbon content. As the Ni to be used in the present invention, extra low carbon grade Ni is preferred.

In the case of Ni having a low carbon content, an aging embrittlement phenomenon hardly occurs, and even if the temperature is about 500 to 600° C., carbon is not deposited at a grain boundary as graphite so that there is a tendency that Ni hardly turns brittle as a material, and therefore, such Ni is preferred.

Examples of the Ni-based alloy include Ni—Cr, Ni—Cr—Mo, and Ni—Cr—W alloys, in which the Fe content is limited to preferably 7% by mass or less, more preferably 5% by mass or less. Further, from the viewpoint that the selective elution of Fe or Co in a fluorine environment is prevented, the Ni-based alloy is preferably a Ni-based alloy having an Fe content of 5.0% by mass or less and a Co content of 2.0% by mass or less.

In light of the above points, the metal containing Ni is preferably a Ni-based alloy having a Ni content exceeding 40% by mass, more preferably a Ni-based alloy having a Ni content exceeding 45% by mass, and particularly preferably a Ni-based alloy having a Ni content exceeding 50% by mass.

The mode of constituting the reaction vessel using such an alloy is not particularly limited. The reaction vessel may be formed by directly lining or coating the inner surface of a pressure resistant vessel, or a capsule composed of a material having excellent corrosion resistance may be disposed in a pressure resistant vessel.

Pure Ni is soft and has good workability, and therefore, it is possible to easily form the reaction vessel by lining the inner surface of the vessel with pure Ni to a thickness of about 0.5 mm. Further, it is also possible to change the lining about once every several years.

As the shape of the reaction vessel, an arbitrary shape such as a cylindrical shape can be adopted. Further, the reaction vessel may be used by being disposed vertically, laterally, or obliquely.

(Crystal Growth)

In the production method of the present invention, a nitride crystal is grown on the surface of a seed crystal having a hexagonal crystal structure in a reaction vessel having the seed crystal, a nitrogen-containing solvent, a raw material, and a mineralizer placed therein by performing control so that the solvent is in a supercritical state and/or a subcritical state. The pressure conditions at this time are as described above.

Further, it is preferred that a region where a nitride crystal is grown and a region where the raw material is dissolved are allowed to coexist in one crystal production apparatus, and the temperatures of both regions are controlled, respectively.

While growing a crystal, it is preferred to set the temperature at which the raw material is dissolved (the temperature of the raw material dissolving region) and the temperature at which a crystal is grown on the surface of the seed crystal (the temperature of the crystal growing region) to different temperatures.

The temperature of the crystal growing region is preferably 450° C. or higher, more preferably 500° C. or higher, and still more preferably 550° C. or higher. Further, it does not matter if the temperature of the crystal growing region is high, however, the temperature of the crystal growing region can be preferably set to, for example, 700° C. or lower, or 650° C. or lower, and the temperature is sometimes preferably lower than 650° C.

The temperature of the raw material dissolving region is set higher than the temperature of the crystal growing region in the case where a mineralizer having a positive solubility characteristic is used. Alternatively, it is set lower than the temperature of the crystal growing region in the case where a mineralizer having a negative solubility characteristic is used. Incidentally, the mineralizer which is preferably used in the present invention has a negative solubility characteristic, and therefore, it is preferred that the temperature at which the raw material is dissolved is set lower than the temperature at which a crystal is grown.

Incidentally, the "positive solubility characteristic" means that the slope of the solubility with respect to the temperature is positive (the solubility increases as the temperature increases), and the "negative solubility characteristic" means that the slope of the solubility with respect to the temperature is negative (the solubility decreases as the temperature increases).

A temperature difference between the raw material dissolving region and the crystal growing region is set to generally 30° C. or more and preferably 40° C. or more, and generally set to 150° C. or less and preferably 120° C. or less.

In the production method of the present invention, a crystal can be grown at a relatively higher growth rate. By optimizing the pressure and the concentration of the mineralizer, the crystal growth rate can be increased to 300 μm/day or more, further increased to 500 μm/day or more, still further increased to 700 μm/day or more, and yet still further increased to 900 μm/day or more.

The production method of the present invention can realize a higher growth rate than the conventional method even if the method is performed at a low temperature and a low pressure.

(Nitride Single Crystal)

According to the production method of the present invention, nitride single crystals having various elemental compositions can be produced. The elemental composition thereof is not particularly limited, however, a single crystal of a nitride of a single metal of an element in Group 13 of the periodic table such as Al, Ga, or In can be preferably produced.

Examples of the single crystal of a nitride of a metal in Group 13 of the periodic table include GaN, AlN, and InN, and also include single crystals of nitrides of alloys such as GaInN and GaAlN. The present invention is particularly preferred in the case of obtaining a single crystal of a nitride of a metal including Ga among these.

The production method of the present invention is capable of performing the crystal growth by setting the temperature of the crystal growing region higher than that of the raw material dissolving region, and a crystal grown under such conditions has a characteristic that the quality is high. For example, in the grown crystal, photoluminescence (PL) emission called "band edge emission" is observed at a luminescence wavelength of around 350 to 380 nm (photon energy: 3.2 to 3.6 eV).

In general, it is shown that when a band edge emission peak appears on a shorter wavelength side (the photon energy is larger), and also the half width of the band edge emission peak is smaller, the crystal contain fewer impurities, and therefore, a crystal showing such a property is preferred. Further, it is shown that as the band edge emission intensity is higher, the purity is higher, and therefore, a crystal showing such a property is preferred.

In general, the quality of a crystal can be determined based on the intensity ratio (YB/NBE) of the yellow band emission (YB) observed at a luminescence wavelength of 500 to 600 nm to the band edge emission (NBE). The yellow band emission is observed when a crystal has a Ga defect, and therefore, it can be said that as the value of YB/NBE is smaller, a crystal has fewer defects.

The intensity ratio (YB/NBE) is preferably 10 or less, more preferably 1 or less, and still more preferably 0.8 or less.

In addition to this, according to the production method of the present invention, the half width of the rocking curve of a (100) diffraction peak in x-ray diffraction can be set to 150 seconds or less.

Further, the nitride single crystal to be produced by the production method of the present invention also has a characteristic that the impurity concentration is low. For example, the oxygen concentration as measured by the SIMS analysis can be decreased to about 1/100 of that in the case where ammonium iodide is used as the mineralizer, and the $1\times10^{18}$ atoms/cc level can be achieved.

Further, as the F concentration, the $1\times10^{15}$ atoms/cc level, as the Fe concentration, the $1\times10^{19}$ atoms/cc level, and as the Ni concentration, the $1\times10^{15}$ atoms/cc level can be achieved, respectively.

As described above, according to the production method of the present invention, a nitride single crystal having a high purity and high quality can be efficiently produced.

[Method for Producing Nitride Single Crystal According to Second Embodiment]

Next, a method for producing a nitride single crystal according to a second embodiment will be described.

(Characteristic Feature of Production Method According to Second Embodiment)

As the method for producing a nitride single crystal according to the second embodiment, the following production methods (a) to (c) can be exemplified.

A first method for producing a nitride single crystal according to the second embodiment of the present invention (hereinafter simply referred to as "production method (a)") includes a crystal growing step in which a nitride crystal is grown by using a mineralizer in an atmosphere of a nitrogen-containing solvent in a supercritical state and/or a subcritical state in a reaction vessel, and is characterized in that Ni is contained in at least a part of the surface of the reaction vessel and the surface of a member used inside the reaction vessel, and the mineralizer is a fluorine-based mineralizer and does not contain a halogen atom other than a fluorine atom.

A second method for producing a nitride single crystal according to the second embodiment of the present invention (hereinafter simply referred to as "production method (b)") includes a crystal growing step in which a nitride crystal is grown by using a mineralizer in an atmosphere of a nitrogen-containing solvent in a supercritical state and/or a subcritical state in a reaction vessel and a coating film forming step in which a fluorine-containing coating film is formed on at least a part of the surface of the reaction vessel and the surface of a member used inside the reaction vessel, and is characterized in that Ni is contained in at least a part of the surface of the reaction vessel and the surface of a member used inside the reaction vessel.

A third method for producing a nitride single crystal according to the second embodiment of the present invention (hereinafter simply referred to as "production method (c)") includes a crystal growing step in which a nitride crystal is grown by using a mineralizer in an atmosphere of a nitrogen-containing solvent in a supercritical state and/or a subcritical state in a reaction vessel, and is characterized in that at least a part of the surface of the reaction vessel and the surface of a member used inside the reaction vessel is coated with a fluorine-containing coating film.

The production method (a) includes at least a crystal growing step, however, by using only a fluorine-based mineralizer which does not contain a halogen atom other than a fluorine atom as the mineralizer, a fluorine-containing coating film can be formed on at least a part of the surface of the reaction vessel and the surface of a member used inside the reaction vessel, in which Ni is contained.

Similarly, the production method (b) includes, in addition to the crystal growing step, a coating film forming step in which a fluorine-containing coating film is formed on at least a part of the surface of the reaction vessel and the surface of a member used inside the reaction vessel, in which Ni is contained.

As described above, the fluorine-containing coating film is a coating film to be formed on the surface of the reaction vessel and the like, in which Ni is contained. These steps may be performed separately and sequentially, or may be performed simultaneously. Since a time required for all the steps can be reduced, it is preferred to perform the coating film forming step simultaneously with at least part of the crystal growing step.

In the production method (c), the crystal growth is performed in the reaction vessel in which at least a part of the surface of the reaction vessel and the surface of a member used inside the reaction vessel is coated with the fluorine-containing coating film.

Further, in the production methods (a) to (c) of the present invention, the crystal growing step and/or the coating film forming step may be performed multiple times. Even if the crystal growing step and/or the coating film forming step may be performed multiple times, the fluorine-containing coating film formed on at least a part of the inner surface of the reaction vessel and the surface of a member used inside the reaction vessel stably exists, and therefore, the reaction vessel and/or the member can be used for a long period of time without being corroded, and thus, the productivity is greatly improved.

The nitride single crystal to be obtained by the production method according to the second embodiment of the present invention is not particularly limited, however, a single crystal of a nitride of a single metal of an element in Group 13 of the periodic table such as Al, Ga, or In is preferred. Examples of the single crystal of a nitride of a metal in Group 13 of the periodic table include GaN, AlN, and InN, and also include single crystals of nitrides of alloys such as GaInN and GaAlN. The present invention is particularly preferred in the case of obtaining a single crystal of a nitride of a metal including Ga among these.

(Crystal Production Apparatus)

The respective steps of the present invention according to the second embodiment are performed using a crystal production apparatus in which a reaction vessel for growing a crystal in an atmosphere of a nitrogen-containing solvent in a supercritical state and/or a subcritical state is disposed in at least a pressure resistant vessel.

At least a part of the inner surface of the reaction vessel and the surface of a member used inside the reaction vessel is coated with a fluorine-containing coating film. The details of the fluorine-containing coating film will be described in the item of the description of the coating film forming step.
(Reaction Vessel)

The "reaction vessel" means a vessel for producing a nitride crystal in a state where a nitrogen-containing solvent in a supercritical state and/or a subcritical state can be in direct contact with an inner wall surface thereof, and an internal structure itself of a pressure resistant vessel, a capsule to be disposed in a pressure resistant vessel, and the like can be exemplified as preferred examples.

The pressure resistant vessel to be used in the present invention according to the second embodiment is selected from those which can withstand high temperature and high pressure conditions when a nitride crystal is grown by the ammonothermal method. In the production methods (a) to (c) of the present invention, Ni is contained in at least a part of the surface of the reaction vessel and the surface of a member used inside the reaction vessel.

That is, the reaction vessel and the like is preferably composed of a metal containing Ni, and more preferably composed of a Ni system alloy having excellent corrosion resistance in a nitrogen-containing solvent such as ammonia. More preferred is a Ni-based alloy.

Examples of the metal containing Ni include pure Ni having a carbon content of 0.2% by mass or less (Ni 200, Ni 201, etc.); a Ni-based alloy having a Ni content of 40% by mass or more and a content of Fe and Co as impurity elements of 5% by mass or less (for example, Inconel 625, etc. (Inconel is a registered trademark of Huntington Alloys Canada Limited, hereinafter the same shall apply)); and a Ni—Cu alloy having a Ni content of 40% by mass or more (Monet 400, etc.).

The Ni-based alloy may contain Cr, Al, Ti, Nb, or V which forms a nitride in a supercritical $NH_3$ environment, and may further contain W or Mo as a solid solution strengthening element.

Examples of the above-described pure Ni include "Ni 200" which meets the standard of having a carbon content of 0.2% by mass or less and "Ni 201" which meets the standard of having an extra low carbon content. As the Ni to be used in the present invention, extra low carbon grade Ni is preferred.

In the case of Ni having a low carbon content, aging embrittlement hardly occurs, and even if the temperature is about 500 to 600° C., carbon is not deposited at a grain boundary as graphite so that there is a tendency that Ni hardly turns brittle as a material, and therefore, such Ni is preferred.

Examples of the Ni-based alloy include Ni—Cr, Ni—Cr—Mo, and Ni—Cr—W alloys, in which the Fe content is limited to preferably 7% by mass or less, more preferably 5% by mass or less. Further, from the viewpoint that the selective elution of Fe or Co in a fluorine environment is prevented, the Ni-based alloy is preferably a Ni-based alloy having an Fe content of 5.0% by mass or less and a Co content of 2.0% by mass or less.

In light of the above points, the metal containing Ni is preferably a Ni-based alloy having a Ni content exceeding 40% by mass, more preferably a Ni-based alloy having a Ni content exceeding 45% by mass, and particularly preferably a Ni-based alloy having a Ni content exceeding 50% by mass.

The carbon content in the metal containing Ni, that is, in at least a part of the surface of the reaction vessel and the surface of a member used inside the reaction vessel, in which the metal is contained, is preferably 0.2% by mass or less, more preferably 0.1% by mass or less, and particularly preferably 0.05% by mass or less from the viewpoint of embrittlement.

The Fe content in the metal containing Ni, that is, in at least a part of the surface of the reaction vessel and the surface of a member used inside the reaction vessel, in which the metal is contained, is preferably 8.0% by mass or less, more preferably 5.0% by mass or less, and particularly preferably 2.0% by mass or less from the viewpoint of reactivity with fluorine.

The Co content in the metal containing Ni, that is, in at least a part of the surface of the reaction vessel and the surface of a member used inside the reaction vessel, in which the metal is contained, is preferably 8% by mass or less, more preferably 5% by mass or less, and particularly preferably 3% by mass or less from the viewpoint of reactivity with fluorine.

For example, in the metal containing Ni to be used in the surface of the reaction vessel and the like, the Fe concentration is preferably the $1\times10^{19}$ atoms/cc level, and the Ni concentration is preferably the $1\times10^{17}$ atoms/cc level as measured by the SIMS analysis.

The metal containing Ni, that is, at least a part of the surface of the reaction vessel and the surface of a member used inside the reaction vessel, in which the metal is contained, preferably contains at least one type selected from Cr, Al, Ti, Nb, V, W, and Mo. That is, in the case of using the Ni-based alloy, the Ni-based alloy may contain Cr, Al, Ti, Nb, or V which forms a nitride in a supercritical $NH_3$ environment, and may further contain W or Mo as a solid solution strengthening element.

The compositional ratio of such an alloy may be appropriately selected according to the conditions of temperature and pressure of the solvent in the system, the mineralizer to be contained in the system and the reactivity with the reaction product thereof, and/or an oxidative ability, a reducing ability, and conditions such as pH.

The alloy to be used in such a pressure resistant vessel has high corrosion resistance, but does not have high corrosion resistance to such an extent that the quality of the crystal is not affected at all. When such an alloy is placed in an atmosphere of a nitrogen-containing solvent in a supercritical state and/or a subcritical state, particularly in a harsher corrosive environment containing the mineralizer, a component such as Ni, Cr, or Fe is dissolved in the solution resulting in being incorporated in the crystal.

Therefore, in the present invention, in order to prevent corrosion of the inner surface of such a pressure resistant vessel, the mineralizer to be used is limited to a mineralizer containing only a fluorine atom as a halogen atom, whereby the inner surface of the reaction vessel is coated with a fluorine-containing coating film.

The mode of constituting the reaction vessel is not particularly limited, however, by a method in which the inner surface of a pressure resistant vessel is directly lined or coated, it is difficult to line or coat the entire surface, which can be in contact with the nitrogen-containing solvent, in the reaction vessel. Therefore, a method in which a capsule composed of a material having excellent corrosion resistance is disposed in a pressure resistant vessel can be exemplified as a more preferred mode.

However, pure Ni is soft and has good workability, and therefore, it is possible to easily form a reaction vessel by lining the inner surface of the vessel with pure Ni to a thickness of about 0.5 mm. Further, it is also possible to change the lining about once every several years.

As the shape of the reaction vessel, an arbitrary shape such as a cylindrical shape can be adopted. Further, the reaction vessel may be used by being disposed vertically, laterally, or obliquely.

(Member)

The production method of the present invention according to the second embodiment is generally performed in a state where a member is disposed in the reaction vessel. The "member" as used herein means a component which is disposed in the vessel when producing a nitride crystal by the ammonothermal method and can be separated from the reaction vessel. Examples thereof include a growing frame for holding a seed crystal, a baffle plate for controlling the convection flow of the solution, a raw material basket, and a wire for suspending a seed crystal.

In the present invention, it is preferred to also coat the surface of such a member with a material having excellent corrosion resistance as described above.

A specific example of the crystal production apparatus including a reaction vessel which can be used in the production method of present invention according to the second embodiment is shown in FIG. 1. FIG. 1 is a schematic view of the crystal production apparatus which can be used in the present invention.

The crystal production apparatus shown in FIG. 1 is an apparatus with which a crystal is grown in an autoclave, however, an apparatus with which a crystal is grown in a capsule (reaction vessel) installed in an autoclave as an inner cylinder may be adopted.

The internal autoclave in FIG. 1 is constituted by a raw material dissolving region 1 for dissolving a raw material and a crystal growing region 2 for growing a crystal. In the raw material dissolving region 1, a solvent and a mineralizer can be placed along with a raw material 4, and in the crystal growing region 2, a seed crystal 6 can be placed by, for example, suspending it with a wire.

Between the raw material dissolving region 1 and the crystal growing region 2, a baffle plate 5 for partitioning the two regions is disposed. The baffle plate 5 has an aperture ratio of preferably from 2 to 60%, more preferably from 3 to 40%.

The material of the surface of the baffle plate 5 is preferably the same as the material of the capsule serving as the reaction vessel. Further, in order to impart higher corrosion resistance and to increase the purity of the crystal to be grown, the surface of the baffle plate 5 preferably contains at least one type selected from the group consisting of Ni, Ta, W, Mo, Ti, Nb, Pd, Pt, Au, Ir, and pBN, more preferably contains at least one type selected from the group consisting of Ni, Pd, Pt, Au, Ir, and pBN, and particularly preferably is a metal containing Ni.

In the case where a crystal is grown in a capsule (reaction vessel) installed in an autoclave as an inner cylinder, a second solvent can be charged in a space between the inner wall of the autoclave and the outer wall of the capsule, and nitrogen gas can be charged from a nitrogen cylinder through a valve, or ammonia can be charged from an ammonia cylinder as the second solvent while confirming the flow rate with a mass flow meter. Further, it is also possible to perform necessary pressure reduction with a vacuum pump.

Incidentally, in the crystal production apparatus to be used when performing the method for producing a nitride single crystal, it is not always necessary to provide a valve, a mass flow meter, and a conduit tube.

Hereinafter, the respective steps of the production method of the present invention will be described in detail.

The crystal growing step is a step of growing a crystal in an atmosphere of a nitrogen-containing solvent in a supercritical state and/or a subcritical state in a reaction vessel.

(Crystal Growing Step)

The "ammonothermal method" is a method for producing a desired material by utilizing the dissolution-precipitation reaction of a raw material using a nitrogen-containing solvent such as ammonia in a supercritical state and/or a subcritical state.

When the ammonothermal method is applied to crystal growth, a supersaturated state due to a temperature difference is generated by utilizing the temperature dependence of the solubility of a raw material in a nitrogen-containing solvent such as ammonia, whereby a crystal is deposited. The crystal growth by the ammonothermal method is a reaction in an environment of a nitrogen-containing solvent in a supercritical state at a high temperature and a high pressure, and further, the solubility of gallium nitride or the like in a nitrogen-containing solvent such as pure ammonia in a supercritical state is very low, and therefore, in order to accelerate the crystal growth by improving the solubility, a mineralizer can be used.

The crystal growth is performed by, for example, placing a raw material, a solvent containing a nitrogen atom, and a seed crystal in a reaction vessel, and increasing the temperature in the reaction vessel to the growth temperature of a nitride single crystal.

(Seed Crystal)

As the seed crystal, a single crystal of a nitride to be grown as a grown crystal can be used. Specific examples of the seed crystal include single crystals of nitrides such as gallium nitride (GaN) and aluminum nitride (AlN).

The seed crystal can be determined by considering the solubility in the solvent and the reactivity with the mineralizer. For example, as the seed crystal of GaN, a single crystal obtained by epitaxially growing a crystal on a heterogeneous substrate of sapphire or the like, followed by peeling, a single crystal obtained by growing a crystal from metal Ga with the use of Na, Li, or Bi as a flux, a homo/heteroepitaxially grown single crystal obtained by using a liquid phase epitaxial method (LPE method), a single crystal produced according to a solution growth method, a crystal obtained by cutting such a single crystal, or the like can be used.

A specific method for the above-described epitaxial growth is not particularly limited, and for example, a hydride vapor phase epitaxy method (HVPE method), a metal organic chemical vapor deposition method (MOCVD method), a liquid phase method, an ammonothermal method, or the like can be adopted.

(Mineralizer)

The mineralizer in the production method (a) is a fluorine-based mineralizer and does not contain a halogen atom other than a fluorine atom. That is, only a mineralizer containing only a fluorine atom as a halogen element is used.

Examples of such a mineralizer containing only a fluorine atom as a halogen element include ammonium fluoride; hydrogen fluoride; hydrocarbyl ammonium fluoride; alkyl ammonium salts such as tetramethyl ammonium fluoride, tetraethyl ammonium fluoride, benzyltrimethyl ammonium fluoride, dipropyl ammonium fluoride, and isopropyl ammonium fluoride; alkyl metal fluorides such as sodium alkyl fluorides; alkali fluorides; alkaline earth metal fluorides; and metal fluorides.

Among these, preferred are an alkali fluoride, an alkaline earth metal fluoride, a metal fluoride; ammonium fluoride, and hydrogen fluoride, more preferred are an alkali fluoride, ammonium fluoride, and a fluoride of a metal in Group 13 of the periodic table, and particularly preferred are ammonium fluoride ($NH_4F$) and gallium fluoride.

As for the use amount of the mineralizer to be used in the ammonothermal method, the molar concentration of the fluorine atom contained in the mineralizer with respect to the nitrogen-containing solvent is preferably 0.1% by mole or more, more preferably 0.3% by mole or more, and still more preferably 0.5% by mole or more. Further, the molar concentration of the fluorine atom contained in the mineralizer with respect to the nitrogen-containing solvent is preferably 30% by mole or less, more preferably 20% by mole or less, and still more preferably 10% by mole or less.

If the concentration is too low, the solubility is decreased so that the growth rate tends to be decreased. On the other hand, if the concentration is too high, the solubility is increased excessively so that spontaneous nucleation is increased or the degree of supersaturation is increased excessively, and thus, the control tends to be difficult, and so on.

Further, since there is no fear that fluorine corrodes the apparatus when the obtained crystal is used as a substrate for producing a device, the fluorine concentration in the crystal in the crystal growing step is preferably $1 \times 10^{17}$ atoms/cc or less, more preferably $5 \times 10^{16}$ atoms/cc or less, and particularly preferably $1 \times 10^{16}$ atoms/cc or less.

(Solvent)

As the solvent to be used in the ammonothermal method, a nitrogen-containing solvent can be used. As the nitrogen-containing solvent, those exemplified in the first embodiment can be preferably adopted.

(Raw Material)

As the raw material, a raw material containing an element constituting a nitride single crystal to be grown on the seed crystal can be used, and those exemplified in the first embodiment can be adopted.

From the viewpoint of reduction in cost by mass production, the growth rate of the crystal growth is preferably 50 μm/day or more, more preferably 100 μm/day or more, and particularly preferably 150 μm/day or more.

Further, the oxygen concentration (atoms/cc) in the reaction vessel in the crystal growing step is the $1 \times 10^{18}$ level, which is about 1/100 of that in the case where a mineralizer containing an iodine atom is used as the mineralizer in the same autoclave.

That is, as described above, by using only a fluorine-containing mineralizer containing only a fluorine atom as a halogen atom in the mineralizer, the purity of a grown crystal can be improved.

As for the reaction time when a nitride single crystal is grown by the ammonothermal method in the crystal growing step, since the seed crystal is sometimes dissolved in the early stage of the crystal growing step, from the viewpoint that a larger crystal than the seed crystal is grown and the grown crystal is used as a substrate for a variety of devices, the lower limit of the reaction time can be set to 6 hours or more, further can be set to 12 hours or more, and still further can be set to 24 hours or more. Similarly, from the viewpoint of prevention of the dissolution of the seed crystal due to depletion of the raw material, the upper limit of the reaction time can be set to 2400 hours or less, further can be set to 2160 hours or less, and still further can be set to 1440 hours or less.

As for the growth pressure when a nitride single crystal is grown by the ammonothermal method in the crystal growing step, from the viewpoint that the growth rate can be increased, the lower limit of the growth pressure can be set to 3 MPa or more, further can be set to 5 MPa or more, and still further can be set to 10 MPa or more. Similarly, from the viewpoint that the production of the pressure resistant vessel is facilitated or the handling during the production is facilitated, the upper limit of the growth pressure can be set to 250 MPa or less, further can be set to 200 MPa or less, and still further can be set to 150 MPa or less.

As for the growth temperature when a nitride single crystal is grown by the ammonothermal method in the crystal growing step, a crystal can be grown in a crystal growth range of 300° C. or higher, however, a negative solubility characteristic is shown and the solubility is reversed, so that a crystal having good quality can be obtained by growing a crystal at a high temperature range, and therefore, the lower limit of the growth temperature is set to preferably 500° C. or higher, more preferably 550° C. or higher, and still more preferably 580° C. or higher. Similarly, from the viewpoint that the production of the pressure resistant vessel is facilitated or the handling during the production is facilitated, the upper limit of the growth temperature can be set to 650° C. or lower, further can be set to 630° C. or lower, and still further can be set to 620° C. or lower.

(Coating Film Forming Step)

The coating film forming step is a step of forming a fluorine-containing coating film on at least a part of the inner surface of the reaction vessel and the surface of a member used inside the reaction vessel. In the production method (a), by using only a fluorine-based mineralizer containing only fluorine as a halogen in the growing step, a fluorine-containing coating film can be formed on the surface of the reaction vessel and the like. By replacing this method with the production method (b), as described above, the coating film forming step is performed simultaneously with the crystal growing step.

When the fluorine-containing coating film is formed on the inner surface of the reaction vessel and the like, in which Ni is contained, in the coating film forming step, the coating film is presumed to function as a passivation film, and thus, it is possible to effectively prevent the corrosion of the inner surface of the reaction vessel and the like in a supercritical state and/or a subcritical state.

By preventing the corrosion of the inner surface of the reaction vessel, the purity of the grown crystal can be increased. Therefore, the crystals (semiconductors) obtained according to the production methods (a) to (c) of the present invention have high transparency.

The thickness of the fluorine-containing coating film is preferably from 5 Nm to 50 μm. In particular, the fluorine-containing coating film is stable in the crystal growing step and the like, and the operation is performed in an automatically repairing environment, and thus, a particularly thick film is not needed, and the coating film may have a thickness substantially equivalent to the outermost surface of the material (10 to 100 nm).

Further, the fluorine-containing coating film of, for example $NiF_2$ or the like has an extremely low vapor pressure in a high temperature range as compared with iron fluoride, chromium fluoride, and cobalt fluoride and stably exists as a solid $NiF_2$ coating film, and therefore, thinning due to evaporation hardly occurs. On the other hand, nickel chloride, chromium chloride, iron chloride, nickel iodide, iron iodide, or chromium iodide generated in a chlorine or iodine environment have a high vapor pressure and are converted into a gas phase and selectively eluted in the solvent $NH_3$ environment to cause corrosion or thinning of the reaction vessel or contamination of the crystal to be obtained.

Further, the operation environment is always a fluorination atmosphere, and therefore, the operation is performed in an environment in which the fluorine-containing coating film can be self-repaired, and thus, in the ammonothermal method in a fluorination atmosphere, it is not necessary to perform a fluorination treatment or the like beforehand, and the production method can be performed while forming a self-repairing coating film.

The above-described fluorine-containing coating film is extremely stable to the nitrogen-containing solvent in a supercritical state and/or a subcritical state or a solution in which the mineralizer, the raw material, and the like are dissolved therein as described above, and therefore, in the case where at least a part of the inner surface of the reaction vessel and the surface of a member used inside the reaction vessel is coated therewith, the reaction vessel or the member is not corroded, and impurities in the nitride crystal to be obtained can be reduced.

Since the impurities are further reduced, 50% or more of the total area of the inner surface of the reaction vessel and the surface composed of a material containing Ni of a member used inside the reaction vessel is preferably coated therewith, more preferably 70% or more, further more preferably 80% or more, and particularly preferably 90% or more of the total area is coated therewith, and 100% of the total area may be coated therewith.

The fluorine-containing coating film is not particularly limited as long as it contains a fluorine atom, and may contain a metal other than Ni as long as the effect of the present invention is exhibited. For example, the fluorine-containing coating film may contain a metal functioning as a dopant of the nitride crystal such as Si, Ca, Mg, or Zn.

Incidentally, in the case where the coating film forming step is performed multiple times, the thickness of the fluorine-containing coating film tends to increase with the increase in the number of the coating film forming steps.

(Method for Forming Coating Film)

The method for forming the fluorine-containing coating film is not particularly limited, and for example, it can be formed by increasing the temperature and the pressure in an environment in which a fluorine atom and a metal capable of reacting with a fluorine atom exist in the reaction vessel.

Specifically, the coating film can be formed by increasing the temperature and the pressure in an environment in which the fluorine-based mineralizer and a metal such as Ni, Fe, Cr, or Co exist.

When forming the coating film, the nitrogen-containing solvent in a supercritical state and/or a subcritical state, the mineralizer, or the like may exist in the reaction vessel, and when the coating film forming step is performed simultaneously with at least part of the crystal growing step, the steps can be simplified, and therefore, it is preferred to adopt the same conditions as those for the crystal growing step.

The coating film forming step may be performed in a state where the fluorine-containing coating film has already been formed on the inner surface of the reaction vessel and the surface of a member used inside the reaction vessel.

When forming the coating film, it is preferred to remove a substance other than the substances necessary for the crystal growing step such as oxygen or water from the reaction vessel.

Specifically, the concentration of such a substance is preferably decreased to 100 ppm or less, more preferably 50 ppm or less, and still more preferably 10 ppm or less.

As a specific method for reducing such a substance, nitrogen purge in the reaction vessel, vacuum suction, and the like can be exemplified. It is preferred to perform nitrogen purge and vacuum suction in combination. Further, heating of the reaction vessel may be performed along with vacuum suction.

The present invention is preferably performed by combining the above-described conditions for forming the fluorine-containing coating film. For example, a mode in which in the presence of the nitrogen-containing solvent in a supercritical state and/or a subcritical state and the fluorine-based mineralizer in the reaction vessel, the temperature is set to 400 to 700° C. and the pressure is set to 100 to 700 MPa can be preferably adopted.

The nitrogen single crystal obtained as described above contains few impurities, and further, since the crystal growth is performed in a high temperature range, the quality of the crystal is good, and also the PL intensity is high. In addition, according to the production method of the present invention, a transparent bulk crystal can be produced under conditions capable of increasing the size.

EXAMPLES

Hereinafter, the characteristic features of the present invention will be more specifically described with reference to Examples and Comparative Examples. The materials, use amounts, ratios, processing contents, processing procedures and the like set forth in the following Examples can be appropriately changed without departing from the gist of the present invention. Accordingly, the scope of the present invention should not be construed as being limited to specific examples described below.

[Examples According to First Embodiment and Comparative Examples]

Example A-1

By using a crystal production apparatus (autoclave) shown in FIG. 1, a nitride single crystal was grown according to the following procedure.

In the lower portion of a platinum-lined autoclave (volume: about 119 mL) having an inside dimension such that the diameter was 22 mm and the length was 293 mm, a GaN acicular crystal having an outer diameter of 2.00 mm produced by the ammonothermal method was placed as a seed crystal 6, and subsequently, a baffle plate 5 was disposed in the autoclave. Then, as a raw material 4, 38.6 g of polycrystalline GaN produced by the HVPE method was placed in the upper portion above the baffle plate.

Subsequently, as the mineralizer, fully dried $NH_4F$ having a purity of 99.99% was fed above the raw material at 2.0% by mole with respect to the charging amount of $NH_3$ to be used as the solvent. Immediately thereafter, a lid of the autoclave to which a valve was attached was closed, and the weight of the autoclave was measured.

Subsequently, a conduit tube was operated so as to communicate with a vacuum pump section through the valve attached to the autoclave, and the valve was opened to vacuum-degas the autoclave. Thereafter, while maintaining the vacuum state, the autoclave was cooled with dry ice-methanol, and then, the valve was temporarily closed.

Subsequently, the conduit tube was operated so as to communicate with an $NH_3$ cylinder through the valve, and the valve was opened again, whereby $NH_3$ was continuously charged in the autoclave without being exposed to the outside air. After NH$_3$ as a liquid was charged in the autoclave by controlling the flow rate, the valve was closed again.

The temperature of the autoclave was returned to room temperature, and the outer surface was fully dried, and then, an increment corresponding to the weight of the charged NH$_3$ was measured.

Subsequently, the autoclave was housed in an electric furnace composed of a heater divided into two upper and lower portions. The temperature of the crystal growing region in the lower portion 2 in the autoclave was increased to 615° C., and the temperature of the raw material dissolving region in the upper portion 1 was increased to 567° C., and the autoclave was maintained at the temperature for 96 hours.

The pressure in the autoclave was 50 MPa. Further, the variation in temperature while maintaining the autoclave was controlled to be +/−5° C. or less. At this time, the value of the following formula: pressure [MPa]×concentration of mineralizer [mole/mole of NH$_3$] was 1.0. Thereafter, the temperature of the outer surface of the lower portion of the autoclave was decreased to 50° C. over about 9 hours, and then, heating by the heater was stopped and the autoclave was allowed to cool spontaneously in the electric furnace.

After it was confirmed that the temperature of the outer surface of the lower portion of the autoclave was decreased to substantially room temperature, first, the valve attached to the autoclave was opened to remove NH$_3$ in the autoclave. Thereafter, the weight of the autoclave was measured to confirm that NH$_3$ was discharged.

Subsequently, the valve was temporarily closed, and the conduit tube was operated so as to communicate with the vacuum pump, and then, the valve was opened again, whereby NH$_3$ in the autoclave was almost completely removed. Thereafter, the lid of the autoclave was opened, and the seed crystal was taken out.

When the seed crystal after growth was observed, the diameter of the acicular seed crystal was increased to 2.60 mm. The growth rate of the outer diameter at this time was 150 μm/day, and the growth rate in the m-axis direction was 75 μm/day.

Examples A-2 to A-29

Crystal growth was performed in the same manner as in Example A-1 except that the concentration of the mineralizer, the temperature of the upper portion, the temperature of the lower portion, and the pressure were changed to the conditions shown in Table 1, and as the seed crystal, a GaN crystal having a C-plane as a principal plane produced by the HVPE method was added.

Incidentally, in Example A-13, as the mineralizer, fully dried NH$_4$I having a purity of 99.99% was fed at 0.5% by mole with respect to the charging amount of NH$_3$ to be used as the solvent. The growth rates in the +c-axis direction (Ga plane) and/or the m-axis direction are shown in Table 1.

When PL measurement was performed at room temperature for the crystals obtained in Examples A-3 and A-5, a band edge emission was confirmed at around 364 nm in both crystals.

Further, when the SIMS analysis was performed for the crystal obtained in Example A-7, it was confirmed that the oxygen concentration was the 1×10$^{18}$ atoms/cc level, which is about 1/100 of that in the case where ammonium iodide was used as the mineralizer in the same autoclave. Further, the fluorine concentration was about 7×10$^{15}$ atoms/cc, the Fe concentration was 1×10$^{19}$ atoms/cc, and the Ni concentration was the 1×10$^{15}$ atoms/cc level.

Further, in Example A-5, after the crystal was grown, the raw material was all dissolved, and a large amount of polycrystalline GaN was deposited on the inner wall surface in the crystal growing region. When a GaN single crystal grown on the C-plane of the seed crystal was taken out from the GaN polycrystalline block and observed, the growth rate of a Ga polar plane was 752 μm/day, and the grown crystal was a single crystal. However, the seed crystal was buried in the polycrystal deposited in the reaction vessel, and thus, the growth was stopped in midstream because the seed crystal was buried in the polycrystalline block, the raw material was depleted during the growth process, and so on, and thus, the actual growth rate is faster than this.

Incidentally, although not shown in Table 1, in the case where the concentration of the mineralizer was set to 0.25% by mole, and the value of the following formula: pressure× concentration of mineralizer was set to 0.34, there was a tendency that the growth rate was slightly decreased as compared with the cases of Examples A-1 to A-29.

Example A-30

As the seed crystal, a GaN crystal having an m-plane as a principal plane with a size of 10 mm×5 mm×330 μm produced by the ammonothermal method was fastened with a platinum wire and placed in the crystal forming region, and crystal growth was performed in the same manner as in Example A-1.

After the crystal was grown, a yellowish transparent crystal was obtained. The grown crystal was observed by a stereomicroscope and a fluorescence microscope. In the observation of the grown surface of the m-plane, a crack was not observed. The crystal was grown to 1820 μm in the thickness direction, and the total growth rate on both surfaces was 455 μm/day. The half width of the (100) diffraction of the x-ray rocking curve of the grown crystal was 142 seconds, and a favorable result was obtained.

Comparative Example A-1

In Comparative Example A-1, crystal growth was performed according to the following procedure by using ammonium iodide as the mineralizer.

In the same manner as in Example A-1, the autoclave shown in FIG. 1 was used. However, a mineralizer having a positive solubility characteristic in ammonia serving as the solvent was to be used, and therefore, the upper portion of the reaction vessel was defined as a crystal growing region, the lower portion of the reaction vessel was defined as a raw material dissolving region, and a seed crystal and a raw material were placed.

In the lower portion of the autoclave, 15.1 g of polycrystalline GaN produced by the HVPE method was placed, further as the mineralizer, fully dried NH$_4$I having a purity of 99.999% was fed at 1.5% by mole with respect to the charging amount of NH$_3$.

Subsequently, a baffle plate was disposed in the autoclave, and as the seed crystal, GaN produced by the HVPE method was placed in the upper portion above the baffle plate. Immediately thereafter, a lid of the autoclave to which a valve was attached was closed, and the weight of the autoclave was measured.

Subsequently, a conduit tube was operated so as to communicate with a vacuum pump section through the valve attached to the autoclave, and the valve was opened to vacuum-degas the autoclave. Thereafter, while maintaining the vacuum state, the autoclave was cooled with dry ice-methanol, and then, the valve was temporarily closed.

Subsequently, the conduit tube was operated so as to communicate with an $NH_3$ cylinder through the valve, and the valve was opened again, whereby $NH_3$ was continuously charged in the autoclave without being exposed to the outside air. After $NH_3$ as a liquid was charged in the autoclave by controlling the flow rate, the valve was closed again.

The temperature of the autoclave was returned to room temperature, and the outer surface was fully dried, and then, an increment corresponding to the weight of the charged $NH_3$ was measured.

Subsequently, the autoclave was housed in an electric furnace composed of a heater divided into two upper and lower portions. The temperature of the crystal growing region (upper portion) in the autoclave was increased to 558° C., and the temperature of the raw material dissolving region in the lower portion was increased to 616° C., and the autoclave was maintained at the temperature for 96 hours.

The pressure in the autoclave was 83 MPa. Further, the variation in temperature while maintaining the autoclave was controlled to be +/−5° C. or less. At this time, the value of the following formula: pressure [MPa]×concentration of mineralizer [mole/mole of $NH_3$] was 1.24.

Thereafter, the temperature of the outer surface of the lower portion of the autoclave was decreased to 50° C. over about 9 hours, and then, heating by the heater was stopped and the autoclave was allowed to cool spontaneously in the electric furnace. After it was confirmed that the temperature of the outer surface of the lower portion of the autoclave was decreased to substantially room temperature, first, the valve attached to the autoclave was opened to remove $NH_3$ in the autoclave.

Thereafter, the weight of the autoclave was measured to confirm that $NH_3$ was discharged. Subsequently, the valve was temporarily closed, and the conduit tube was operated so as to communicate with the vacuum pump, and then, the valve was opened again, whereby $NH_3$ in the autoclave was almost completely removed.

Thereafter, the lid of the autoclave was opened, and the seed crystal was taken out. When the seed crystal after growth was observed, the weight of the seed crystal was slightly increased, however, the total growth rate in the +c-axis direction (Ga plane) and in the −c-axis direction (N plane) was about 10.5 µm/day.

Comparative Example A-2

Crystal growth was performed in the same manner as in Comparative Example A-1 except that the mineralizer was changed to $NH_4Cl$, and the concentration of the mineralizer, the temperature of the upper portion, the temperature of the lower portion, and the pressure were changed to the conditions shown in Table 1. The total growth rate in the +c-axis direction (Ga plane) and in the −c-axis direction (N plane) was about 26.3 µm/day.

Comparative Example A-3

An autoclave (internal volume: about 345 cm$^3$) made of RENE 41 having an inside dimension such that the diameter was 30 mm and the length was 450 mm was used as a pressure resistant vessel, and a capsule made of Pt—Ir was used as a reaction vessel, and crystal growth was performed.

A charging operation in the capsule was performed in a glove box under a fully dried nitrogen atmosphere.

As the raw material, 50.98 g of polycrystalline GaN particles were weighed and placed in a region in the upper portion of the capsule (raw material dissolving region). Subsequently, as the mineralizer, fully dried $GaF_3$ having a purity of 99.999% was weighed such that the F concentration with respect to the charging amount of $NH_3$ was 1% by mole and fed to the capsule.

Further, a baffle plate made of platinum was disposed between the raw material dissolving region in the upper portion and the crystal growing region in the lower portion. As the seed crystals, two wafers (10 mm×5 mm×0.3 mm) having a C-plane of a hexagonal GaN single crystal grown by the HYPE method as a principal plane, two wafers (5 mm×7.5 mm×0.3 mm) having an M-plane as a principal plane, and one particulate crystal (about 5 mm×5 mm×5 mm) formed through spontaneous nucleation by the HVPE method were used.

The principal planes of the seed crystals except for the particulate crystal were finished by chemical mechanical polishing (CMP), and it was confirmed that the surface roughness Rms measured by an atomic force microscope was 0.5 nm or less. These seed crystals were placed in the crystal growing region in the upper portion of the capsule by suspending them with a platinum wire having a diameter of 0.2 mm within a seed crystal supporting frame made of platinum.

Subsequently, a cap made of Pt—Ir was connected by welding to the upper portion of the capsule, and thereafter, the weight was measured. Then, a valve was connected to the tube attached to the upper portion of the cap, and the capsule was vacuum-degassed with a vacuum pump. Thereafter, while maintaining the vacuum state, the capsule was cooled with a dry ice-ethanol solvent.

Subsequently, $NH_3$ was charged in the capsule without being exposed to the outside air. After $NH_3$ as a liquid was charged in the capsule in an amount (in terms of $NH_3$ density at −33° C.) corresponding to about 57% of the effective volume of the capsule based on the control of the flow rate, the valve was closed again. The charging amount was confirmed by a difference in weight between before and after charging of $NH_3$.

Subsequently, the capsule was inserted into the autoclave to which a valve was attached, and thereafter, a lid was closed, and then, the weight of the autoclave was measured. Subsequently, the valve attached to the autoclave was opened to vacuum-degas the autoclave. Thereafter, while maintaining the vacuum state, the autoclave 1 was cooled with a dry ice-ethanol solvent.

Subsequently, $NH_3$ was charged in the autoclave without being exposed to the outside air. After $NH_3$ as a liquid was charged in the autoclave in an amount (in terms of $NH_3$ density at −33° C.) corresponding to about 59% of the effective volume (volume of autoclave−volume of charged substances) of the autoclave based on the control of the flow rate, the valve was closed again.

The temperature of the autoclave 1 was returned to room temperature, and the outer surface was fully dried, and then, the weight of the autoclave was measured. The weight of $NH_3$ was calculated based on a difference between the measured weight and the weight before charging $NH_3$, and the charging amount was confirmed.

Subsequently, the autoclave was housed in an electric furnace composed of a heater divided into two upper and lower portions. The temperature was increased over 9 hours such that the temperature of the crystal growing region on the outer surface of the autoclave was increased to 625° C., and the temperature of the raw material dissolving region was increased to 595° C. (average temperature: 610° C.), and after the temperature reached the set temperature, the autoclave was maintained at the temperature for 4.7 days.

The pressure in the autoclave was 250 MPa. Further, the variation in the controlled temperature of the outer surface of the autoclave while maintaining the autoclave was +/−0.3° C. or less.

Thereafter, the temperature of the outer surface of the autoclave was allowed to cool spontaneously until the temperature was returned to room temperature, and then, the valve attached to the autoclave was opened to remove $NH_3$ in the autoclave. Thereafter, the weight of the autoclave was measured to confirm that $NH_3$ was discharged. Subsequently, the lid of the autoclave was opened, and the capsule was taken out.

A hole was made in the tube attached to the upper portion of the capsule, and $NH_3$ was removed from the capsule. When the inside of the capsule was confirmed, a gallium nitride crystal was deposited on the entire surfaces of the C-plane and the M-plane of all the seed crystals. The growth rate varies depending on the plane orientation, and was 100 μm/day on the Ga plane, 140 μm/day on the N-plane, 150 μm/day on the M-plane, and 330 μm/day on the A-plane.

In the crystal grown on the N-plane, a pastel crayon like defect could be confirmed by visual observation. Further, when the M-plane was observed by a light microscope, it was confirmed that many cracks were formed.

(PL Evaluation 1)

PL measurement was performed by irradiating a sample with a beam having an intensity of 38 W/$cm^2$ using a He-Cd laser wavelength: 325 nm) as a light source, and measuring a luminescence emission spectrum using a spectrometer (model No. C5094) manufactured by Hamamatsu Photonics K.K. and a detector (model No, BT-CCD PMA-50) manufactured by Hamamatsu Photonics K.K.

The PL measurement was performed for the gallium nitride crystals grown on the GaN seed crystal having a. c-plane as a principal plane produced by the HVPE method in Example A-3 and Comparative Examples A-1 and A-2. The results are shown in FIGS. 2 and 3. Incidentally, in FIG. 2, the PL intensity is expressed as a logarithm.

In the case of the crystals of Example A-3 and Comparative Example A-1, a band. edge emission peak was observed at around 364 nm, however, in the case of Comparative Example A-2 in which ammonium chloride was used as the mineralizer, a peak was not observed. Based on these results, it was found that the crystal of Comparative Example A-2 has poor crystallinity as compared with the crystals of Example A-3 and Comparative Example A-1.

In the case of Example A-3, the band edge emission peak energy was 3.407 eV, and the half width was 76 meV. On the other hand, in the case of Comparative Example A-1, the band edge emission peak energy was 3.387 eV, and the half width was 155 meV.

TABLE 1

| | Type of mineralizer | Concentration of mineralizer [% by mol] | Temperature of upper portion [° C.] | Temperature of lower portion [° C.] | Pressure [MPa] | Time [h] | Pressure [MPa] × Concentration of mineralizer [mol/mol of $NH_3$] | Growth rate Orientation/rate [μm/day] |
|---|---|---|---|---|---|---|---|---|
| Example A-1 | $NH_4F$ | 2 | 567 | 615 | 50 | 96 | 1 | m/75 |
| Example A-2 | $NH_4F$ | 1.5 | 567 | 615 | 147 | 96 | 2.21 | Ga/180, m/600 |
| Example A-3 | $NH_4F$ | 2 | 567 | 615 | 110 | 96 | 2.2 | Ga/450, m/900 |
| Example A-4 | $NH_4F$ | 2 | 567 | 615 | 90 | 96 | 1.8 | Ga/270, m/720 |
| Example A-5 | $NH_4F$ | 2 | 567 | 615 | 176 | 96 | 3.52 | Ga/752 |
| Example A-6 | $NH_4F$ | 0.5 | 558 | 638 | 135 | 96 | 0.68 | Ga/110, m/120 |
| Example A-7 | $NH_4F$ | 0.5 | 558 | 638 | 147 | 96 | 0.74 | Ga/150, m/140 |
| Example A-8 | $NH_4F$ | 0.5 | 550 | 600 | 110 | 96 | 0.55 | Ga/86 |
| Example A-9 | $NH_4F$ | 1.25 | 550 | 600 | 156 | 96 | 1.95 | Ga/267 |
| Example A-10 | $NH_4F$ | 2 | 567 | 615 | 65 | 96 | 1.3 | m/250 |
| Example A-11 | $NH_4F$ | 0.45 | 490 | 600 | 110 | 96 | 0.5 | Ga/96 |
| Example A-12 | $NH_4F$ | 0.75 | 495 | 600 | 177 | 96 | 1.32 | Ga/120, m/80 |
| Example A-13 | $NH_4F$ + $NH_4I$ | 2.5 (F:I = 2.00:0.50) | 575 | 625 | 94 | 96 | 1.88 | Ga/269, m/80 |
| Example A-14 | $NH_4F$ | 2 | 600 | 662 | 80 | 96 | 1.6 | Ga/65, m/250 |
| Example A-15 | $NH_4F$ | 5 | 567 | 615 | 21 | 96 | 1.05 | Ga/85, m/100 |
| Example A-16 | $NH_4F$ | 5 | 567 | 615 | 6 | 96 | 0.32 | Ga/40, m/35 |
| Example A-17 | $NH_4F$ | 2 | 567 | 615 | 145 | 96 | 2.9 | m/250 |
| Example A-18 | $NH_4F$ | 2.54 | 567 | 615 | 100 | 96 | 2.54 | Ga/262, m/388 |
| Example A-19 | $NH_4F$ | 4 | 567 | 615 | 59 | 96 | 2.36 | Ga/125, m/260 |
| Example A-20 | $NH_4F$ | 4.89 | 617 | 665 | 53 | 96 | 2.59 | Ga/225, m/150 |
| Example A-21 | $NH_4F$ | 2.87 | 565 | 615 | 85 | 96 | 2.44 | Ga/158 m/220 |
| Example A-22 | $NH_4F$ | 3 | 567 | 615 | 66 | 96 | 1.98 | Ga/85, m/150 |
| Example A-23 | $NH_4F$ | 5 | 567 | 615 | 30 | 96 | 1.5 | Ga/133, m/225 |
| Example A-24 | $NH_4F$ | 5 | 567 | 615 | 55 | 96 | 2.75 | m/330 |
| Example A-25 | $NH_4F$ | 5 | 582 | 617 | 50 | 96 | 2.5 | Ga/68, m/170 |
| Example A-26 | $NH_4F$ | 3.5 | 582 | 617 | 51 | 96 | 1.79 | Ga/83, m/125 |
| Example A-27 | $NH_4F$ | 3.47 | 517 | 565 | 59 | 96 | 2.05 | Ga/75, m/150 |
| Example A-28 | $NH_4F$ | 2 | 590 | 620 | 125 | 96 | 2.5 | Ga/45, m/130 |
| Example A-29 | $NH_4F$ | 1.97 | 567 | 615 | 138 | 48 | 2.72 | Ga/115, m/290 |
| Example A-30 | $NH_4F$ | 2.54 | 565 | 615 | 100 | 96 | 2.54 | Ga/131, m/455 |
| Comparative Example A-1 | $NH_4I$ | 1.5 | 558 | 616 | 83 | 96 | 1.24 | Ga + N/11 |
| Comparative Example A-2 | $NH_4Cl$ | 1 | 572 | 662 | 110 | 96 | 1.1 | Ga + N/26 |
| Comparative Example A-3 | $GaF_3$ | 1 | 595 | 625 | 250 | 113 | 2.5 | Ga/100, m/150 |

Further, it is found that in the case of Example A-3, the band edge emission peak energy is larger and the half width is smaller than in the case of Comparative Example A-1. In general, as the band edge emission peak energy is larger and the half width is smaller, there are fewer impurities, Accordingly, the crystal of Example A-3 contains fewer impurities than the crystal of Comparative Example A-1.

In FIG. 3, the intensity ratio (YB/NBE) of the yellow band emission (YB) observed at a luminescence wavelength of 500 to 600 nm to the band edge emission (NBE) in the case of Example A-3 and Comparative Examples A-1 and A-2 is shown.

In the case of Example A-3, YB/NBE was 12.85, in the case of Comparative Example A-1, YB/NBE was 22.06, and in the case of Comparative Example A-2, YB/NBE could not be calculated because no band edge emission peak could be detected.

In general, yellow band emission is observed when there is a Ga defect, and therefore, as the value of YB/NBE is smaller, the crystal has fewer defects. Therefore, in Example A-3 in which crystal growth was performed using ammonium fluoride as the mineralizer, a crystal having fewer defects was obtained as compared with Comparative Example A-1 or A-2 in which crystal growth was performed using ammonium iodide or ammonium chloride was used as the mineralizer.

Based on these results, it was found that when a F-containing mineralizer is used, a crystal having fewer impurities, fewer defects, and higher quality can be obtained as compared with the case where crystal growth is performed using an I-containing mineralizer or a Cl-containing mineralizer.

(PL Evaluation 2)

PL measurement was performed at room temperature for the grown surface of the m-plane on which the crystal growth of gallium nitride was performed on the seed having the m-plane as the plate-like principal plane in Example A-30 and Comparative Example A-3. As the measurement method, the method described in PL Evaluation 1 was used. The results are shown in FIGS. 4 and 5. Incidentally, in FIG. 4, the PL intensity is expressed as a logarithm.

In the case of Example A-30, the band edge emission peak energy was 3.413 eV, and the half width was 56 meV. On the other hand, in the case of Comparative Example A-3, the band edge emission peak energy was 3.407 eV, and the half width was 63 meV.

It is found that in the case of Example A-30, the band edge emission peak energy is larger and the half width was smaller than in the case of Comparative Example A-3. In general, as the band edge emission peak energy is larger and the half width is smaller, there are fewer impurities. Accordingly, the crystal of Example A-30 contains fewer impurities than the crystal of Comparative Example A-3.

Further, when the spectra shown in FIG. 4 were compared, it was confirmed that the band edge emission intensity was higher in the case of Example A-30 in which the growth pressure was set to a low pressure, and thus, the crystal has a higher purity.

In FIG. 5, the intensity ratio (YB/NBE) of the yellow band emission (YB) observed at a luminescence wavelength of 500 to 600 nm to the band edge emission (NBE) in the case of Example A-30 and Comparative Example A-3 is shown.

In the case of Example A-30, YB/NBE was 0.74, and in the case of Comparative Example A-3, YB/NBE was 20.39. In general, yellow band emission is observed when there is a Ga defect, and therefore, as the value of YB/NBE is smaller, the crystal has fewer defects. Therefore, in Examples A-30 in which crystal growth was performed at a low pressure, a crystal having fewer defects was obtained as compared with Comparative Example A-3 in which crystal growth was performed at a high pressure.

Accordingly, it was found that when a F-containing mineralizer is used, a crystal having fewer impurities, fewer defects, and higher quality can be obtained in the case where crystal growth is performed at a low pressure as compared with the case where crystal growth is performed at a high pressure.

Based on the above results, it was confirmed that in Examples in which a crystal was grown by using a mineralizer containing a fluorine atom and setting the pressure to 10 to 200 MPa, a nitride single crystal could be efficiently grown. On the other hand, in Comparative Examples in which a crystal was grown without using a mineralizer containing a fluorine atom, a sufficient growth rate could not be achieved.

[Examples According to Second Embodiment and Comparative Examples]

Examples B-1 and B-2

(Corrosion Test Using Test Piece)

A baffle plate was disposed in a Pt-lined autoclave (volume: about 119 mL) having an inside dimension such that the diameter was 22 mm and the length was 293 mm, and as the mineralizer, fully dried $NH_4F$ having a purity of 99.99% was fed thereto at 0.5% by mole with respect to the charging amount of $NH_3$.

Subsequently, a test piece (10 mm×10 mm) made of Inconel 625 was placed in the upper portion and the lower portion. Immediately thereafter, a lid of the autoclave to which a valve was attached was closed, and the weight of the autoclave was measured.

Subsequently, a conduit tube was operated so as to communicate with a vacuum pump section through the valve attached to the autoclave, and the valve was opened to vacuum-degas the autoclave. Thereafter, while maintaining the vacuum state, the autoclave was cooled with dry ice-methanol, and then, the valve was temporarily closed.

Subsequently, the conduit tube was operated so as to communicate with an $NH_3$ cylinder through the valve, and the valve was opened again, whereby $NH_3$ was continuously charged in the autoclave without being exposed to the outside air.

After $NH_3$ as a liquid was charged in the autoclave by controlling the flow rate, the valve was closed again. The temperature of the autoclave was returned to room temperature, and the outer surface was fully dried, and then, an increment corresponding to the weight of the charged $NH_3$ was measured.

Subsequently, the autoclave was housed in an electric furnace composed of a heater divided into two upper and lower portions. The temperature of a region in the lower portion in the autoclave was increased to 588° C., and the temperature of a region in the upper portion was increased to 508° C., and the autoclave was maintained at the temperature for 96 hours. The pressure in the autoclave was 150 MPa. Further, the variation in temperature while maintaining the autoclave was controlled to be +/−5° C. or less.

Thereafter, the temperature of the outer surface of the lower portion of the autoclave was decreased to 50° C. over about 9 hours, and then, heating by the heater was stopped and the autoclave was allowed to cool spontaneously in the electric furnace.

After it was confirmed that the temperature of the outer surface of the lower portion of the autoclave was decreased to substantially room temperature, first, the valve attached to the autoclave was opened to remove $NH_3$ in the autoclave. Thereafter, the weight of the autoclave was measured to confirm that $NH_3$ was discharged. Subsequently, the valve was temporarily closed, and the conduit tube was operated so as to communicate with the vacuum pump, and then, the valve was opened again, whereby $NH_3$ in the autoclave was almost completely removed.

Thereafter, the lid of the autoclave was opened, and the test piece was taken out. A corrosion mark such as roughening was not observed on the surface of the test piece. Further, due to the formation of a fluorine-containing coating film, an increase in weight of 0.001 g could be confirmed.

Examples B-3 to B-6

A test was performed in the same manner as in Examples B-1 and B-2 except that the material of the test piece, the mineralizer, and the temperature were changed and so on as shown in Table 2. Incidentally, the temperature shown in Table 2 is the temperature of the region where each test piece was placed.

After completion of the test, a corrosion mark such as roughening was not observed on the surface of the test piece. Further, due to the formation of a fluorine-containing coating film, an increase in weight of 0.001 to 0.015 g could be confirmed in each case.

Incidentally, Inconel 625 and Ni-12Cr-14Mo have a Ni content exceeding 50%. Further, a plus change in weight indicates that a film has been formed on the surface.

Comparative Examples B-1 to B-22

A test was performed in the same manner as in Example B-1 except that the material of the test piece, the mineralizer, and the temperature were changed and so on as shown in Table 2.

In the case where a mineralizer having a positive solubility characteristic in ammonia serving as a solvent was used, the seed crystal and the raw material were placed by using the upper portion of the autoclave as the crystal growing region and using the lower portion of the autoclave as the raw material dissolving region. Incidentally, the temperature shown in Table 2 is the temperature of the region where each test piece was placed. After completion of the test, in some test pieces, a decrease in weight or a loss of the test piece was observed. In the other test pieces, no increase or decrease in weight was observed, and it was confirmed that a fluorine-containing coating film of Ni—F was not formed.

TABLE 2

| | Test piece | Mineralizer | Concentration of mineralizer [%] | Temperature [° C.] | Pressure [MPa] | Time [h] | Change in weight [g] |
|---|---|---|---|---|---|---|---|
| Example B-1 | Inconel 625 | $NH_4F$ | 0.5 | 508 | 150 | 96 | 0.001 |
| Example B-2 | | | 0.5 | 588 | 150 | 96 | 0.001 |
| Example B-3 | Ni—12Cr—14Mo | $NH_4F$ | 0.5 | 508 | 150 | 96 | 0.002 |
| Example B-4 | | | 0.5 | 588 | 150 | 96 | 0.004 |
| Example B-5 | Ni | $NH_4F$ | 1.25 | 550 | 156 | 96 | 0.005 |
| Example B-6 | | | 1.25 | 600 | 156 | 96 | 0.015 |
| Comparative Example B-1 | | $NH_4F/NH_4I$ | 1.1/0.87 | 558 | 90 | 96 | −0.042 |
| Comparative Example B-2 | | | 1.1/0.87 | 638 | 90 | 96 | −0.122 |
| Comparative Example B-3 | | $NH_4Br$ | 1 | 572 | 140 | 96 | −0.068 |
| Comparative Example B-4 | | | 1 | 662 | 140 | 96 | −0.465 |
| Comparative Example B-5 | Ag | $NH_4F$ | 0.5 | 558 | 135 | 96 | minus |
| Comparative Example B-6 | | | 0.5 | 638 | 135 | 96 | minus |
| Comparative Example B-7 | | $NH_4F/NH_4I$ | 0.25/1.0 | 558 | 130 | 96 | minus |
| Comparative Example B-8 | | | 0.25/1.0 | 638 | 130 | 96 | minus |
| Comparative Example B-9 | Pt | $NH_4F$ | 0.5 | 558 | 135 | 96 | minus |
| Comparative Example B-10 | | | 0.5 | 638 | 135 | 96 | minus |
| Comparative Example B-11 | Nb | $NH_4F$ | 0.5 | 558 | 135 | 96 | minus |
| Comparative Example B-12 | | | 0.5 | 638 | 135 | 96 | minus |
| Comparative Example B-13 | Ta | $NH_4F$ | 0.45 | 486 | 120 | 6 | minus |
| Comparative Example B-14 | | | 0.45 | 622 | 120 | 6 | minus |
| Comparative Example B-15 | | $NH_4Cl$ | 1 | 478 | 190 | 16 | minus |
| Comparative Example B-16 | | | 1 | 620 | 190 | 16 | minus |
| Comparative Example B-17 | | $NH_4Br$ | 1 | 572 | 140 | 96 | minus |
| Comparative Example B-18 | | | 1 | 662 | 140 | 96 | minus |

TABLE 2-continued

| | Test piece | Mineralizer | Concentration of mineralizer [%] | Temperature [° C.] | Pressure [MPa] | Time [h] | Change in weight [g] |
|---|---|---|---|---|---|---|---|
| Comparative Example B-19 | Mo | $NH_4F/NH_4I$ | 0.25/2.0 | 558 | 135 | 96 | minus |
| Comparative Example B-20 | | | 0.25/2.0 | 638 | 135 | 96 | minus |
| Comparative Example B-21 | TaC | $NH_4F/NH_4I$ | 0.35/1.0 | 558 | 115 | 96 | minus |
| Comparative Example B-22 | | | 0.35/1.0 | 638 | 115 | 96 | minus |

Based on the above results, in Examples in which a test piece containing a Ni-based alloy was used and a mineralizer which did not contain a halogen other than fluorine was used, a plus change in weight was observed, and a film containing a fluorine atom was formed on the surface of the test piece. On the other hand, in the test pieces of Comparative Examples, a minus change in weight was observed, and the test pieces were corroded.

Based on the above-described Examples using the test pieces, it is found that in the case where a nitride single crystal is produced by the ammonothermal method using a mineralizer containing only fluorine as the mineralizer in the reaction vessel in which the inner wall of the reaction vessel is composed of a metal containing Ni, the reaction vessel is coated with a fluorine-containing coating film, and thus, the corrosion of the inner wall of the reaction vessel and a member used inside the reaction vessel can be prevented.

Example B-7

In the lower portion of a Pt-lined autoclave (volume: about 119 mL) having an inside dimension such that the diameter was 22 mm and the length was 293 mm, a GaN crystal produced by the HYPE method was placed as the seed crystal. Subsequently, a baffle plate was disposed in the autoclave. Then, as the raw material, 44.5 g of polycrystalline GaN produced by the HVPE method was placed in the upper portion above the baffle plate.

Subsequently, as the mineralizer, fully dried $NH_4F$ having a purity of 99.99% was fed above the raw material at 0.5% by mole with respect to the charging amount of $NH_3$. Thereafter, a gasket made of Inconel 625 was attached thereto, and immediately thereafter, a lid of the autoclave to which a valve was attached was closed, and the weight of the autoclave was measured.

Subsequently, a conduit tube was operated so as to communicate with a vacuum pump section through the valve attached to the autoclave, and the valve was opened to vacuum-degas the autoclave. Thereafter, while maintaining the vacuum state, the autoclave was cooled with dry ice-methanol, and then, the valve was temporarily closed.

Subsequently, the conduit tube was operated so as to communicate with an $NH_3$ cylinder through the valve, and the valve was opened again, whereby $NH_3$ was continuously charged in the autoclave without being exposed to the outside air. After $NH_3$ as a liquid was charged in the autoclave by controlling the flow rate, the valve was closed again. The temperature of the autoclave was returned to room temperature, and the outer surface was fully dried, and then, an increment corresponding to the weight of the charged $NH_3$ was measured.

Subsequently, the autoclave was housed in an electric furnace composed of a heater divided into two upper and lower portions. The temperature of the crystal growing region (lower portion) in the autoclave was increased to 638° C., and the temperature of the raw material dissolving region (upper portion) was increased to 558° C., and the autoclave was maintained at the temperature for 96 hours. The pressure in the autoclave was 147 MPa.

Thereafter, the temperature of the outer surface of the lower portion of the autoclave was decreased to 50° C. over about 9 hours, and then, heating by the heater was stopped and the autoclave was allowed to cool spontaneously in the electric furnace.

After it was confirmed that the temperature of the outer surface of the lower portion of the autoclave was decreased to substantially room temperature, first, the valve attached to the autoclave was opened to remove $NH_3$ in the autoclave. Thereafter, the weight of the autoclave was measured to confirm that $NH_3$ was discharged. Subsequently, the valve was temporarily closed, and the conduit tube was operated so as to communicate with the vacuum pump, and then, the valve was opened again, whereby $NH_3$ in the autoclave was almost completely removed.

Thereafter, the lid of the autoclave was opened, and the seed crystal was taken out. When impurities contained in the GaN crystal on the seed crystal after the crystal was grown were analyzed by SIMS, the Fe concentration was $1 \times 10^{19}$ atoms/cc, and the Ni concentration was the $1 \times 10^{15}$ atoms/cc level.

Based on these results, it is considered that a fluorine-containing coating film has been formed on the gasket made of Inconel 625 containing Ni, and due to this, impurities in the crystal are reduced.

Comparative Example B-23

Crystal growth was performed in the same manner as in Example B-7 except that the type of the mineralizer was changed.

When the SIMS analysis was performed for the obtained grown crystal, it was found that the concentrations of the following impurities: Ni, Fe, and O were increased as compared with Example B-7.

TABLE 3

| | Material of gasket (material of autoclave) | Mineralizer | Impurities in GaN crystal [atoms/cc] | | | |
|---|---|---|---|---|---|---|
| | | | Ni | Fe | Cr | O |
| Example B-7 | Inconel 625 | $NH_4F$ | 3 to $6 \times 10^{15}$ | $1 \times 10^{19}$ | $1 \times 10^{18}$ | $8 \times 10^{18}$ |
| Comparative Example B-23 | Inconel 625 | $NH_4Cl$ | $1 \times 10^{20}$ | $1 \times 10^{20}$ | $1 \times 10^{18}$ | $1 \times 10^{21}$ |

While the present invention has been described in detail with reference to specific embodiments thereof, it will be apparent to those skilled in the art that various changes and modifications can be made therein without departing from the spirit and scope of the present invention.

This application is based on Japanese Patent Application (Patent Application No. 2012-078010) filed on Mar. 29, 2012, Japanese Patent Application (Patent Application No. 2012-078011) filed on Mar. 29, 2012, and Japanese Patent Application (Patent Application No. 2013-053474) filed on Mar. 15, 2013, the contents of which are incorporated herein by reference.

INDUSTRIAL APPLICABILITY

According to the production method of the first embodiment of the present invention, a nitride single crystal can be efficiently grown even under low pressure conditions. Since a pressure resistant vessel having a small wall thickness can be used, a pressure resistant vessel having a large internal volume is produced from a Ni-based ingot having the same diameter, and can be used in the production method of the present invention.

Further, according to the production method of the first embodiment of the present invention, also the energy cost can be reduced. A nitride single crystal such as GaN to be efficiently produced by the production method of the present invention can be used in a wide range of applications such as a blue light emitting diode (LED) composed of a semiconductor of a nitride of an element in Group 13 of the periodic table and a single crystal gallium nitride (GaN) substrate for a blue semiconductor laser (LD). Accordingly, the industrial applicability of the present invention is extremely high.

Further, the production method according to the second embodiment of the present invention is useful for growing a massive single crystal of a nitride of an element in Group 13 of the periodic table, particularly a massive single crystal of GaN.

According to the production method of the second embodiment of the present invention, impurities derived from a reaction vessel or a member in the obtained crystal can be reduced, and further, the reaction vessel having a stable surface during crystal growth can be used multiple times, and therefore, a marked improvement in terms of both time and cost can be expected. Accordingly, the industrial applicability of the present invention is extremely high.

REFERENCE SIGNS LIST

1 Upper portion (raw material dissolving region)
2 Lower portion (crystal growing region)
3 Outer wall
4 Raw material
5 Baffle plate
6 Seed crystal

The invention claimed is:

1. A method for producing a nitride single crystal, the method comprising:
  growing a nitride crystal on the surface of a seed crystal having a hexagonal crystal structure in a reaction vessel comprising. therein the seed crystal, a nitrogen-containing solvent, a mineralizer comprising a fluorine atom, and a raw material, at a pressure in the reaction vessel of 5 to 177 MPa with the nitrogen-containing solvent in at least one of a supercritical state and a subcritical state,
  wherein in the reaction vessel, the temperature of a region where the raw material is dissolved is lower than the temperature of a region where the nitride crystal is grown on the surface of the seed crystal, and
  wherein one or both of the following conditions apply:
    a) the pressure in the reaction vessel is 10 to 156 MPa;
    b) the temperature of the region where the raw material is dissolved is lower than the temperature of the region where the nitride crystal is grown on the surface of the seed crystal by 30° C. - 150° C.

2. The method for producing a nitride single crystal according to claim 1, wherein the pressure in the reaction vessel is 10 to 156 MPa.

3. The method for producing a nitride single crystal according to claim 1, wherein the temperature of the region where the raw material is dissolved is lower than the temperature of the region where the nitride crystal is grown on the surface of the seed crystal by 30° C.-150° C.

4. The method for producing a nitride single crystal according to claim 1, wherein the reaction vessel further comprises a mineralizer comprising a halogen atom other than a fluorine atom, and wherein the fluorine atom accounts for at least 50% by mole of a total amount of all the halogen atoms in all the mineralizers.

5. The method for producing a nitride single crystal according to claim 1, wherein the pressure in the reaction vessel and the concentration of the fluorine atom the mineralizer with respect to the nitrogen-containing solvent satisfy the following formula:

$$0.4 \leq P \times M \leq 3.0$$

wherein P represents the pressure [unit: MPa] in the reaction vessel and M represents the concentration [unit: mole/mole of solvent] of the fluorine atom contained in the mineralizer with respect to the nitrogen-containing solvent.

6. The method for producing a nitride single crystal according to claim 1, wherein a temperature at which the nitride crystal is grown on the surface of the seed crystal is 650° C. or lower.

7. The method for producing a nitride single crystal according to claim 1, wherein the reaction vessel comprises a metal containing a Ni-based alloy having a Ni content exceeding 40% by mass.

8. The method for producing a nitride single crystal according to claim 1, comprising controlling the nitrogen-containing solvent to be in a. supercritical state.

9. The method for producing a nitride single crystal according to claim 1, comprising controlling the nitrogen-containing solvent to be in a. subcritical state.

10. The method for producing a nitride single crystal according to claim 1, comprising controlling the nitrogen-containing solvent to be in a supercritical state and a subcritical state.

11. The method for producing a nitride single crystal according to claim 1, wherein the nitride crystal is a GaN crystal, the seed crystal is a GaN single crystal, and the raw material comprises GaN.

12. The method for producing a nitride single crystal according to claim 1. wherein the mineralizer comprises at least one selected from ammonium fluoride, hydrogen fluoride, hydrocarbyl ammonium fluoride, alkyl ammonium fluoride, alkyl metal fluoride, alkali fluoride, alkaline earth metal fluoride and metal fluoride.

13. The method for producing a nitride single crystal according to claim 1, wherein the mineralizer comprises at least one selected from ammonium fluoride and gallium fluoride.

14. The method for producing a nitride single crystal according to claim 1, wherein the nitrogen-containing solvent comprises ammonia.

15. The method for producing a nitride single crystal according to claim 1, wherein a molar concentration of the fluorine atom contained in the mineralizer with respect to the nitrogen-containing solvent is 0.2%-30% by mole.

16. The method for producing a nitride single crystal according to claim 1, wherein a molar concentration of the fluorine atom contained in the mineralizer with respect to the nitrogen-containing solvent is 1.0 %-2.0% by mole.

17. The method for producing a nitride single crystal according to claim 1, wherein the reaction vessel is an autoclave.

18. The method for producing a nitride single crystal according to claim 17, wherein the reaction vessel is a platinum-lined autoclave.

19. The method for producing a nitride single crystal according to claim 1, wherein the crystal produced by said method has an intensity ratio (YB/NBE) of the yellow band emission (YB) observed at a luminescence wavelength of 500 to 600 nm to the band edge emission (NBE) of 10 or less.

20. The method for producing a nitride single crystal according to claim 19, wherein the intensity ratio (YB/NBE) is 0.8 or less.

21. 1 The method for producing a nitride single crystal according to claim 1, wherein the pressure in the reaction vessel is 10 to 156 MPa and the temperature of the region where the raw material is dissolved is lower than the temperature of the region where the nitride crystal is grown on the surface of the seed crystal by 30° C.-150° C.

* * * * *